(12) United States Patent
Lee et al.

(10) Patent No.: US 8,151,157 B2
(45) Date of Patent: Apr. 3, 2012

(54) METHOD OF ENCODING/DECODING USING LOW DENSITY CHECK CODE MATRIX

(75) Inventors: Young Seob Lee, Gyeonggi-do (KR);
 Min Seok Oh, Gyeonggi-do (KR); So Yeon Kim, Gyeonggi-do (KR); Ji Wook Chung, Gyeonggi-do (KR); Ki Hyoung Cho, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 771 days.

(21) Appl. No.: 12/303,245

(22) PCT Filed: Jun. 7, 2007

(86) PCT No.: PCT/KR2007/002758
 § 371 (c)(1),
 (2), (4) Date: Dec. 2, 2008

(87) PCT Pub. No.: WO2007/142476
 PCT Pub. Date: Dec. 13, 2007

(65) Prior Publication Data
 US 2009/0249157 A1 Oct. 1, 2009

(30) Foreign Application Priority Data
 Jun. 7, 2006 (KR) .................. 10-2006-0051166

(51) Int. Cl.
 *G06F 11/00* (2006.01)
(52) U.S. Cl. ........................................ 714/749
(58) Field of Classification Search .......... 714/749
 See application file for complete search history.

(56) References Cited

U.S. PATENT DOCUMENTS

2004/0221223 A1  11/2004  Yu et al.
2007/0162811 A1*  7/2007  Matsumoto ............. 714/749
2007/0226583 A1*  9/2007  Kim et al. ............... 714/758
(Continued)

FOREIGN PATENT DOCUMENTS

WO   2005/036758   4/2005
(Continued)

OTHER PUBLICATIONS

Institute of Electrical and Electronics Engineering (IEEE); "IEEE Standard for Local and metropolitan area networks, Part 16: Air Interface for Fixed and Mobile Broadband Wireless Access Systems, Amendment 2: Physical and Medium Access, Control Layers for Combined Fixed and Mobile Operation in Licensed Bands and Corrigendum 1"; IEEE Std 802.16e™-2005 and IEEE Std 802.16™-2004/Cor1-2005 (Amendment and Corrigendum to IEEE Std 802.16.2004); Feb. 28, 2006.

(Continued)

*Primary Examiner* — Bryce Bonzo
(74) *Attorney, Agent, or Firm* — Lee, Hong, Degerman, Kang & Waimey

(57) ABSTRACT

A method of encoding data using a parity check matrix, a method of decoding encoded data, and a data retransmission method using the same are disclosed. A method of encoding data by LDPC code using a parity check matrix includes variably selecting a specific sub-matrix from a parity check matrix in accordance with a coding rate to be used for encoding, the parity check matrix including at least two sub-matrixes, and encoding an input data stream by using the selected sub-matrix.

40 Claims, 36 Drawing Sheets

U.S. PATENT DOCUMENTS

| | | | |
|---|---|---|---|
| 2008/0288846 A1* | 11/2008 | Kyung et al. | 714/752 |
| 2009/0313520 A1* | 12/2009 | Chung et al. | 714/751 |
| 2010/0100789 A1* | 4/2010 | Yu et al. | 714/752 |
| 2010/0211846 A1* | 8/2010 | Matsumoto et al. | 714/752 |
| 2010/0299572 A1* | 11/2010 | Yokokawa et al. | 714/752 |
| 2011/0087948 A1* | 4/2011 | Murakami et al. | 714/758 |

FOREIGN PATENT DOCUMENTS

| | | |
|---|---|---|
| WO | 2006/039801 | 4/2006 |

OTHER PUBLICATIONS

Zesong, F., et al., "A Type-II Hybrid ARQ Scheme Based on Rate-Compatible LDPC Code"; 2006 International Conference on Communications, Circuits and Systems Proceedings; vol. 2; pp. 879-882; Jun. 25, 2006.

\* cited by examiner

FIG. 7

$$H = \begin{bmatrix} P^{h^b_{00}} & P^{h^b_{01}} & P^{h^b_{02}} & \cdots & P^{h^b_{0\,nb}} \\ P^{h^b_{10}} & P^{h^b_{11}} & P^{h^b_{12}} & \cdots & P^{h^b_{1\,nb}} \\ \cdots & \cdots & \cdots & & \cdots \\ P^{h^b_{mb\,0}} & P^{h^b_{mb\,1}} & P^{h^b_{mb\,2}} & \cdots & P^{h^b_{mb\,nb}} \end{bmatrix} = P^{H_b}$$

$$\begin{bmatrix} 1 & 0 & 0 & 0 \\ 0 & 1 & 0 & 0 \\ 0 & 0 & 1 & 0 \\ 0 & 0 & 0 & 1 \end{bmatrix} \xrightarrow{\text{3 right shift}} \begin{bmatrix} 0 & 0 & 0 & 1 \\ 1 & 0 & 0 & 0 \\ 0 & 1 & 0 & 0 \\ 0 & 0 & 1 & 0 \end{bmatrix}$$

| 0 | 0 | Y_1 | Y_2 | Y_4 | Y_7 | Y_11 | Y_16 | Y_22 | Y_29 | Y_37 |
|---|---|---|---|---|---|---|---|---|---|---|
| 0 | 0 | 0 | Y_3 | Y_5 | Y_8 | Y_12 | Y_17 | Y_23 | Y_30 | Y-38 |
| z_1 | z_11 | z_20 | 0 | 0 | Y_9 | Y_13 | Y_18 | Y_24 | Y_31 | Y_39 |
| z_2 | z_12 | z_21 | z_28 | 0 | Y_10 | Y_14 | Y_19 | Y_25 | Y_32 | Y_40 |
| z_3 | z_13 | z_22 | z_29 | z_35 | 0 | Y_15 | Y_20 | Y_26 | Y_33 | Y_41 |
| z_4 | z_14 | z_23 | z_30 | z_36 | z_41 | 0 | Y_21 | Y_27 | Y_34 | Y_42 |
| z_5 | z_15 | z_24 | z_31 | z_37 | z_42 | z_46 | 0 | Y_28 | Y_35 | Y_43 |
| z_6 | z_16 | z_25 | z_32 | z_38 | z_43 | z_47 | z_50 | 0 | Y_36 | Y_44 |
| z_7 | z_17 | z_26 | z_33 | z_39 | z_44 | z_48 | z_51 | z_53 | 0 | Y_45 |
| z_8 | z_18 | z_27 | z_34 | z_40 | z_45 | z_49 | z_52 | z_54 | z_55 | 0 |
| z_9 | z_19 | | | | | | | | | |
| z_10 | | | | | | | | | | |

$H_p$-part $H_d$-part

| z_1 | z_2 | z_3 | z_4 | z_5 | z_6 | z_7 | z_8 | z_9 | z_10 | |
|---|---|---|---|---|---|---|---|---|---|---|
| 0 | z_11 | z_12 | z_13 | z_14 | z_15 | z_16 | z_17 | z_18 | z_19 | |
| 0 | 0 | z_20 | z_21 | z_22 | z_23 | z_24 | z_25 | z_26 | z_27 | |
| -1 | 0 | 0 | z_28 | z_29 | z_30 | z_31 | z_32 | z_33 | z_34 | |
| -1 | -1 | 0 | 0 | z_35 | z_36 | z_37 | z_38 | z_39 | z_40 | H$_p$-part |
| -1 | -1 | -1 | 0 | 0 | z_41 | z_42 | z_43 | z_44 | z_45 | |
| -1 | -1 | -1 | -1 | 0 | 0 | z_46 | z_47 | z_48 | z_49 | |
| -1 | -1 | -1 | -1 | -1 | 0 | 0 | z_50 | z_51 | z_52 | |
| -1 | -1 | -1 | -1 | -1 | -1 | 0 | 0 | z_53 | z_54 | |
| -1 | -1 | -1 | -1 | -1 | -1 | -1 | 0 | 0 | z_55 | |
| -1 | -1 | -1 | -1 | -1 | -1 | -1 | -1 | 0 | 0 | |
| -1 | -1 | -1 | -1 | -1 | -1 | -1 | -1 | -1 | y_1 | |
| | | | | | | | | | | |
| | | | | | | | | | | |
| | | | | | | | | | | |
| | | | | | | | | | | H$_d$-part |
| | | | | | | | | | | |
| | | | | | | | | | | |
| | | | | | | | | | | |
| | | | | | | | | | | |
| | | | | | | | | | | |
| | | | | | | | | | | |

Accumulator Structure

| 0 | 1 | 0 | 1 | 1 | 0 | 0 | 0 |
|---|---|---|---|---|---|---|---|
| 1 | 0 | 1 | 0 | 1 | 1 | 0 | 0 |
| 0 | 1 | 0 | 0 | 0 | 1 | 1 | 0 |
| 1 | 0 | 1 | 1 | 0 | 0 | 1 | 1 |

Parity Check Matrix H

×

| a0 |
|----|
| a1 |
| a2 |
| a3 |
| p0 |
| p1 |
| p2 |
| p3 | codeword c

=

| 0 |
|---|
| 0 |
| 0 |
| 0 |

$a_1 \oplus a_3 \oplus p_0 = 0$        $p_0 = a_1 \oplus a_3$ $a_0 \oplus a_2 \oplus p_0 \oplus p_1 = 0$        $p_1 = a_0 \oplus a_2 \oplus p_0$ $a_1 \oplus p_1 \oplus p_2 = 0$        $p_2 = a_1 \oplus p_1$ $a_0 \oplus a_2 \oplus a_3 \oplus p_2 \oplus p_3 = 0$        $p_3 = a_0 \oplus a_2 \oplus a_3 \oplus p_2$

FIG. 18B

Parity Check Matrix

Model Matrix

| | v1 | v2 | v3 | v4 | v5 | v6 | v7 | v8 | v9 | v10 | v11 | v12 | v13 | v14 | v15 | v16 | v17 | v18 | v19 | v20 | v21 | v22 | v23 | v |
|---|---|---|---|---|---|---|---|---|---|---|---|---|---|---|---|---|---|---|---|---|---|---|---|---|
| C1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| C2 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| C3 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 |
| C4 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 |
| C5 | 1 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 |
| C6 | 0 | 1 | 0 | 0 | 0 | 1 | 0 | 0 | 0 | 0 | 0 | 0 | 0 | 0 | 0 | 0 | 0 | 0 | 0 | 0 | 0 | 0 | 0 | 0 |
| C7 | 0 | 0 | 1 | 0 | 0 | 0 | 1 | 0 | 0 | 0 | 0 | 0 | 0 | 0 | 0 | 0 | 0 | 0 | 0 | 0 | 0 | 0 | 0 | 0 |
| C8 | 0 | 0 | 0 | 1 | 0 | 0 | 0 | 1 | 0 | 0 | 0 | 0 | 0 | 0 | 0 | 0 | 0 | 0 | 0 | 0 | 0 | 0 | 0 | 0 |
| C9 | 0 | 0 | 0 | 0 | 1 | 0 | 0 | 0 | 1 | 0 | 0 | 0 | 0 | 0 | 0 | 0 | 0 | 0 | 0 | 0 | 0 | 0 | 0 | 0 |
| C10 | 0 | 0 | 0 | 0 | 0 | 1 | 0 | 0 | 0 | 1 | 0 | 0 | 0 | 0 | 0 | 0 | 0 | 0 | 0 | 0 | 0 | 0 | 0 | 0 |
| C11 | 0 | 0 | 0 | 0 | 0 | 0 | 1 | 0 | 0 | 0 | 1 | 0 | 0 | 0 | 0 | 0 | 0 | 0 | 0 | 0 | 0 | 0 | 0 | 0 |
| C12 | 0 | 0 | 0 | 0 | 0 | 0 | 0 | 1 | 0 | 0 | 0 | 1 | 0 | 0 | 0 | 0 | 0 | 0 | 0 | 0 | 0 | 0 | 0 | 0 |
| C13 | 0 | 0 | 0 | 0 | 0 | 0 | 0 | 0 | 1 | 0 | 0 | 0 | 1 | 0 | 0 | 0 | 0 | 0 | 0 | 0 | 0 | 0 | 0 | 0 |
| C14 | 0 | 0 | 0 | 0 | 0 | 0 | 0 | 0 | 0 | 1 | 0 | 0 | 0 | 1 | 0 | 0 | 0 | 0 | 0 | 0 | 0 | 0 | 0 | 0 |
| C15 | 0 | 0 | 0 | 0 | 0 | 0 | 0 | 0 | 0 | 0 | 1 | 0 | 0 | 0 | 1 | 0 | 0 | 0 | 0 | 0 | 0 | 0 | 0 | 0 |
| C16 | 0 | 0 | 0 | 0 | 0 | 0 | 0 | 0 | 0 | 0 | 0 | 1 | 0 | 0 | 0 | 1 | 0 | 0 | 0 | 0 | 0 | 0 | 0 | 0 |
| C17 | 0 | 0 | 0 | 0 | 0 | 0 | 0 | 0 | 0 | 0 | 0 | 0 | 1 | 0 | 0 | 0 | 1 | 0 | 0 | 0 | 0 | 0 | 0 | 0 |
| C18 | 0 | 0 | 0 | 0 | 0 | 0 | 0 | 0 | 0 | 0 | 0 | 0 | 0 | 1 | 0 | 0 | 0 | 1 | 0 | 0 | 0 | 0 | 0 | 0 |
| C19 | 0 | 0 | 0 | 0 | 0 | 0 | 0 | 0 | 0 | 0 | 0 | 0 | 0 | 0 | 1 | 0 | 0 | 0 | 1 | 0 | 0 | 0 | 0 | 0 |
| C20 | 0 | 0 | 0 | 0 | 0 | 0 | 0 | 0 | 0 | 0 | 0 | 0 | 0 | 0 | 0 | 1 | 0 | 0 | 0 | 1 | 0 | 0 | 0 | 0 |
| C21 | 0 | 0 | 0 | 0 | 0 | 0 | 0 | 0 | 0 | 0 | 0 | 0 | 0 | 0 | 0 | 0 | 1 | 0 | 0 | 0 | 1 | 0 | 0 | 0 |
| C22 | 0 | 0 | 0 | 0 | 0 | 0 | 0 | 0 | 0 | 0 | 0 | 0 | 0 | 0 | 0 | 0 | 0 | 1 | 0 | 0 | 0 | 1 | 0 | 0 |
| C23 | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 1 | 0 |
| C24 | 0 | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 0 |

Model Matrix:

| 0 | -1 | -1 | -1 | -1 | -1 |
|---|---|---|---|---|---|
| 0 | 0 | -1 | -1 | -1 | -1 |
| -1 | 0 | 0 | -1 | -1 | -1 |
| -1 | -1 | 0 | 0 | -1 | -1 |
| -1 | -1 | -1 | 0 | 0 | -1 |
| -1 | -1 | -1 | -1 | 0 | 0 |

FIG. 19

| | y1 | y2 | y3 | y4 | y5 | y6 | y7 | y8 | y9 | y10 | |
|---|---|---|---|---|---|---|---|---|---|---|---|
| | -1 | -1 | -1 | -1 | -1 | -1 | -1 | -1 | -1 | 0 | 0 |
| | -1 | -1 | -1 | -1 | -1 | -1 | -1 | -1 | 0 | 0 | -1 |
| | -1 | -1 | -1 | -1 | -1 | -1 | -1 | 0 | 0 | -1 | -1 |
| | -1 | -1 | -1 | -1 | -1 | -1 | 0 | 0 | -1 | -1 | -1 |
| | -1 | -1 | -1 | -1 | -1 | 0 | 0 | -1 | -1 | -1 | -1 |
| | -1 | -1 | -1 | -1 | 0 | 0 | -1 | -1 | -1 | -1 | -1 |
| | -1 | -1 | -1 | 0 | 0 | -1 | -1 | -1 | -1 | -1 | -1 |
| | -1 | -1 | 0 | 0 | -1 | -1 | -1 | -1 | -1 | -1 | -1 |
| | -1 | 0 | 0 | -1 | -1 | -1 | -1 | -1 | -1 | -1 | -1 |
| | 0 | 0 | -1 | -1 | -1 | -1 | -1 | -1 | -1 | -1 | -1 | parity part (top rows) / systematic part (bottom rows)

FIG. 21A

|  | a1 | a2 | a3 | a4 | a5 | a6 | p1 | p2 | p3 | p4 | p5 | p6 |
|---|---|---|---|---|---|---|---|---|---|---|---|---|
|  |  |  | 1 |  | 1 |  | 1 |  |  |  |  |  |
|  | 1 |  |  | 1 |  |  | 1 | 1 |  |  |  |  |
|  |  | 1 |  |  |  | 1 |  | 1 | 1 |  |  |  |
|  | 1 |  |  |  | 1 |  |  |  | 1 | 1 |  | 1 |
|  |  |  | 1 |  | 1 |  |  |  |  | 1 | 1 |  |
|  |  | 1 |  |  |  |  |  |  |  |  | 1 | 1 |

FIG. 21B

|  | a1 | a2 | a3 | a4 | a5 | a6 | p1 | p2 | p3 | p4 | p5 | p6 |
|---|---|---|---|---|---|---|---|---|---|---|---|---|
|  |  |  | 1 |  | 1 |  | 1 |  |  |  |  |  |
|  | 1 |  |  | 1 |  |  | 1 | 1 |  |  |  |  |
|  |  | 1 |  |  |  | 1 |  | 1 | 1 |  |  | 1 |
|  | 1 |  |  |  | 1 |  |  |  | 1 | 1 |  | 1 |
|  |  |  | 1 |  | 1 |  |  |  |  | 1 | 1 |  |
|  |  | 1 |  |  |  |  |  |  |  |  | 1 | 1 |

METHOD OF ENCODING/DECODING USING LOW DENSITY CHECK CODE MATRIX

CROSS REFERENCE TO RELATED APPLICATIONS

This application is the National Stage filing under 35U.S.C. 371 of International Application No. PCT/KR2007/002758, filed on Jun. 7, 2007, which claims the benefit of earlier filing date and right of priority to Korean Application No. 10-2006-0051166, filed on Jun. 7, 2006.

TECHNICAL FIELD

The present invention relates to a method of encoding/decoding using a low density parity check (LDPC) code, more particularly, to a method of encoding data using a parity check matrix, a method of decoding encoded data, and a data retransmission method using the same.

BACKGROUND ART

FIG. 1 illustrates a structure of a mobile communication channel to which the present invention and the related art are applied. Hereinafter, the structure of the mobile communication channel will be described with reference to FIG. 1. A transmitter undergoes a channel coding procedure to transmit data without loss or distortion through a radio channel. Examples of the channel coding include convolutional coding, turbo coding, LDPC coding, etc. The data which has undergone the channel coding procedure can be transmitted to the radio channel as a single symbol which includes several bits. At this time, a procedure of mapping several bits to a single symbol is referred to as modulation.

The modulated data is converted into a signal for multiple transmission through a multiplexing procedure or a multiple access method. Examples of the multiplexing procedure include CDM, TDM, FDM, etc. An example of OFDM (Orthogonal Frequency Division Multiplexing) is shown in FIG. 1. The signal which has undergone the multiplexing block is changed to a structure suitable for transmission to one or more multi-antennas, and then is transferred to a receiver through the radio channel. Fading and thermal noise occur in the transmitted data when the data passes through the radio channel. For this reason, distortion may occur in the data.

The modulated data is transferred to the receiver through the radio channel. In this case, fading and thermal noise occur in the transmitted data, whereby distortion may occur therein. The receiver performs a series of procedures of the transmitter in reverse order after receiving the distorted data. The receiver performs demodulation to convert the data mapped to the symbol into a bit stream, undergoes channel decoding, and restores the distorted data to the original data.

An apparatus of performing the channel coding stores a matrix H or a matrix G, wherein the matrix H is a parity check matrix used to generate parity bits to be added to input data (systematic bits), and the matrix G is a parity check generate matrix derived from the matrix H. In other words, the transmitter includes an encoder which generates parity bits through the input data and the matrix H or G. An apparatus of performing channel decoding checks whether the systematic bits are restored well, through operation of the received data (distorted systematic bits+parity bits) with the matrix H, and performs operation again if the systematic bits are failed to be restored.

Examples of the modulation include BPSK (Binary Phase Shift Keying), QPSK (Quadrature Phase Shift Keying), 16-QAM (Quadrature Amplitude Modulation), 64-QAM, 256-QAM, etc. For example, 16-QAM maps the data stream which has undergone channel encoding during modulation to a single symbol in a unit of 4 bits. 16-QAM de-maps the single symbol received through the radio channel during demodulation to four bits.

Hereinafter, a data retransmission method that can be used along with the present invention will be described. There are provided various examples of the data retransmission method. Of them, HARQ (Hybrid Automatic Repeat reQuest) method will be described. The HARQ method is obtained by combination of FEC (Forward Error Correction) symbol and ARQ (Automatic Repeat reQuest) which is a retransmission method in a mobile communication system. According to the ARQ method, if error is detected from data received by the receiver, the receiver requests retransmission to a transmitter. Examples of the ARQ method include Stop-And-Wait, Selective Repeat, Go-Back-N, etc. depending on the retransmission method. According to the Stop-And-Wait method, as shown in FIG. 2, if the transmitter receives an acknowledgement (ACK) message from the receiver after transmitting data, the transmitter transmits next data, wherein the ACK message notifies that the receiver has successfully received the data. If the transmitter receives a NACK message from the receiver, wherein the NACK message notifies that the receiver has failed to successfully receive the data, the transmitter retransmits the failed data.

Meanwhile, according to the Go-Back-N method, the transmitter first transmits N number of data and receives ACK messages from the receiver in due order. FIG. 3 illustrates a case of N=7, wherein the number N of data which are transmitted without ACK message is referred to as a window size. If the transmitter receives the NACK message in response to the $k^{th}$ data, the transmitter sequentially transmits data starting from the $k^{th}$ data.

FIG. 4 illustrates a Selective Repeat method. According to the Selective Repeat method, like the Go-Back-N method, the number N of data which are transmitted without ACK or NACK message is referred to as a window size, and retransmission is selectively performed for only data with NACK message.

According to the aforementioned HARQ method, if retransmission is performed in the ARQ method, previously transmitted data is combined with retransmitted data to restore the data through FEC symbol. The HARQ method is classified into a chase combining method and an incremental redundancy method depending on a combining method of the two data. According to the chase combining method, as shown in FIG. 5, the receiver combines transmission data with retransmission data to increase a receiving signal to noise ratio (SNR), thereby increasing a receiving success ratio of data at the receiver.

Meanwhile, unlike the chase combining method, the incremental redundancy method (hereinafter, referred to as 'IR method') transmits some of encoded data, which have not been used for first transmission, during retransmission of the transmitter to decrease a coding rate of data received at the receiver, thereby increasing a receiving success ratio.

Hereinafter, LDPC coding will be described. A concept of LDPC coding is as follows.

A linear code can be described with the parity check generation matrix G and the parity check matrix H. A characteristic of the linear code is that the equation of $Hc^T=0$ is satisfied for every bit of a codeword 'c'. As one of the linear code, the LDPC code which is recently paid attention to was proposed by Gallager in 1962 for the first time. One of the characteristics of the LDPC coding is that most of elements of the parity check matrix H are '0' and the number of elements which are not '0' is small compared to the codeword, so that repetitive decoding based on probability is possible. A parity check matrix H for the first proposed LDPC code was defined in a non-systematic form and each row and column of the parity check matrix were designed to equally have a small weight.

In this case, the weight means the number of '1' included in each row and column.

The LDPC coding scheme has low decoding complexity since a density of elements which are not '0' in the parity check matrix H is low. Further, decoding performance of the LDPC coding is superior to other coding schemes, which is adjacent to the theoretical limit of Shannon. However, the LDPC coding scheme could not be implemented with the hardware technique at the time of proposal by Gallegar, so that the LDPC coding scheme has not been paid attention to by the people for 30 years. A repetitive decoding scheme using graphs was developed in early 1980's and a couple of decoding algorithms for the LDPC code have been developed using the repetitive decoding scheme. One of them is a sum-product algorithm.

The LDPC coding has a superior error correction capability, thereby improving communication speed and capacity. When combined with a multi-input and multi-output (MIMO) scheme, the LDPC coding can be applied to a high speed wireless LAN having a data transmission speed of several hundred Mbit/s, a high speed mobile communication system having a data transmission speed of one Mbit/s for a user moving at a speed of 250 km/h, and an optical communication system having a data transmission speed of 40 Gbit/s. In addition, the LDPC coding can enable a quantum encryption communication diminishing the number of retransmission on a communication path having low quality since transmission quality is improved due to its high error correction capability. Further, data packets having errors can be easily recovered due to the low complexity and superior loss compensation capability of the LDPC coding, so that contents having quality equal to that of TV can be transmitted through the Internet and the mobile communication system. 10G BASE-T transmission within a range of 100 m which has been considered impossible earlier can be realized owing to wide application range and large capacity which are advantages of the LDPC coding. In addition, transmission capacity of a single satellite transmitter having 36 MHz bandwidth can be increased up to 80 Mbit/s which is 1.3 times of usual transmission capacity. With the above described advantages, the LDPC coding scheme is adopted as a next generation coding scheme in a communication system, like IEEE 802.16 or IEEE 802.11, etc.

Hereinafter, a structured LDPC will be described.

A parity check matrix H is used to use LDPC code, and includes most of elements 0 and some elements 1. Since the matrix H has a great size of $10^5$ bits or greater, a large sized memory is required to express the matrix H. The structured LDPC expresses the elements of the matrix H used for LDPC encoding and decoding as a sub-block of a certain size as shown in FIG. 7. In IEEE 802.16e, the sub-block is identified by one integer index to decrease the size of the memory required to store the matrix H. Various kinds of matrixes could be the sub-block. For example, a permutation matrix of a certain size could be the sub-block.

If the structured LDPC is used, one integer (i.e., index) is only needed to be stored in a specific memory instead of a certain sized matrix consisting of elements of 1 or 0. Accordingly, the size of the memory required to express the matrix H can be decreased.

For example, if a size of a codeword reflected in the IEEE802.16e standard is 2304 and a coding rate is 2/3, a model matrix used for LDPC encoding/decoding is as shown in FIG. 8.

As shown in FIG. 8, the structured LDPC matrix of IEEE802.16e consists of elements of −1, 0 and positive integers, wherein −1 represents a zero matrix of which elements are all 0, and 0 represents an identity matrix. The positive integers excluding −1 and 0 constitute a permutation matrix in which the identity matrix is shifted to the right by positive integers. In other words, if elements constituting a matrix are 3, it represents a permutation matrix in which the identity matrix is shifted to the right three times.

Figures 7, 8, 9:
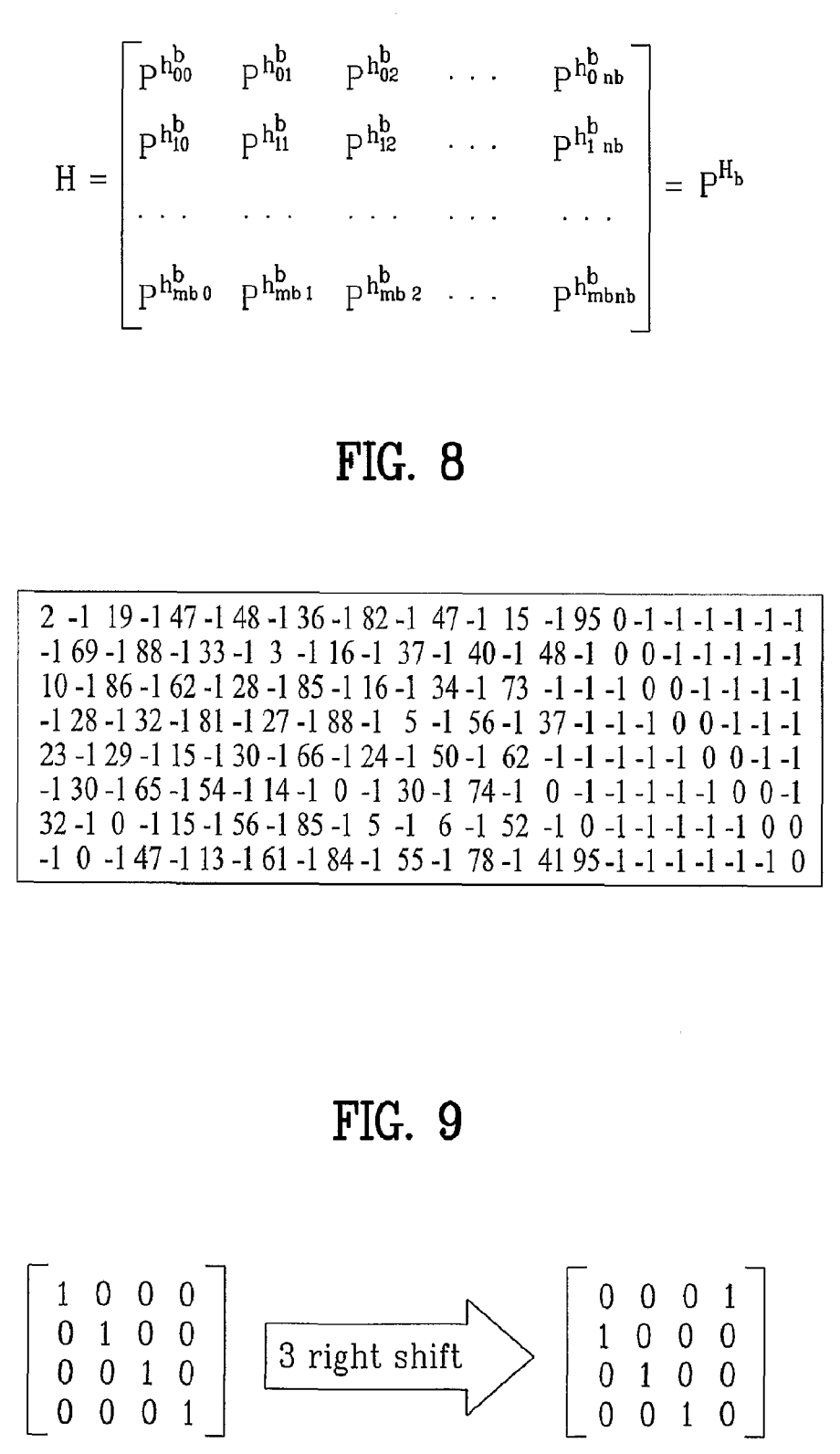

FIG. 9 illustrates a method of expressing a matrix according to the aforementioned positive integers, i.e., shift numbers. It is assumed that a specific matrix H is identified by a structured matrix of 4×4 (i.e., sub-block). In this case, if the specific sub block is identified by 3, the sub-block becomes a matrix of FIG. 9.

Hereinafter, LDPC encoding method will be described.

According to a general LDPC encoding method, information bits are encoded by using a generation matrix G derived from an LDPC parity check matrix H. For generating the generation matrix G, the parity check matrix H is configured in the form of $[P^T:I]$ by using a Gaussian reduction method. Assuming the number of the information bits is 'k' and a size of an encoded codeword is 'n', the 'P' is a matrix having 'k' number of rows and '(n-k)' number of columns and the 'I' is an identity matrix having 'k' number of rows and columns.

When the parity check matrix H is represented in the form of $[P^T:I]$, the generation matrix G has the form of $[I:P]$. The information bits of k bits to be encoded can be represented as a matrix 'x' having one row and 'k' number of columns. In this case, the codeword 'c' is represented in the form of the following equation.

$$c = xG = [x : xP]$$

In the above equation, x represents a systematic part, and xP represents a parity part.

Meanwhile, if encoding is performed by the Gaussian Reduction method as above, since a calculation amount is increased, the form of the matrix H is designed in a specific structure so that a method of directly encoding data in the matrix H without deriving the matrix G is used. In other words, if the equation 1 is multiplied by $H^T$ by using a feature (i.e., $GH^T=0$) that a product between the matrix G and a transpose $H^T$ for the matrix H, the following equation 2 can be obtained. The codeword 'c' can be obtained by adding a parity bit suitable for the equation 2 next to the information bit 'x.'

$$cH^T = xGH^T = [x:xP][P^T:I]^T = 0 \qquad \text{[Equation 2]}$$

Hereinafter, LDPC decoding method will be described.

Data encoded in a communication system includes noise when passing through a radio channel of FIG. 1. A receiver represents a decoding procedure of data through a procedure as shown in FIG. 10. A decoding block of the receiver obtains an information bit 'x' from a receiving signal c' having the encoded codeword 'c' added with noise by using the feature of $cH^T=0$. In other words, assuming that the received codeword is c', a value of $c'H^T$ is calculated. As a result, if the value of $c'H^T$ is 0, first k number of bits from c' are determined as the information bit x. If the value of $c'H^T$ is not 0, c' which satisfies $c'H^T$ of 0 is searched by using a decoding method of a sum-product algorithm through a graph, thereby restoring the information bit x.

Hereinafter, a coding rate of LDPC coding will be described.

Generally, when the size of the information bit is k and the size of the codeword which is actually transmitted is n, a coding rate (R) is as follows.

$$R=k/n \quad \text{[Equation 3]}$$

When the matrix H necessary for LDPC encoding and decoding has a row size of m and a column size of n, a coding rate is as follows.

$$R=1-m/n \quad \text{[Equation 4]}$$

As described above, since the related art LDPC code is encoded and decoded by the matrix H, the structure of the matrix H is very important. In other words, since encoding and decoding performance is greatly affected by the structure of the matrix H, design of the matrix H is more important than anything else.

Hereinafter, the related art problems will be described.

The related art, for example, the LDPC encoding method of IEEE 802.16e, supports various coding rates. To this end, a parity check matrix or a model matrix corresponding to each coding rate is stored in an encoder. For example, since IEEE 802.16e supports a coding rate of 1/2, 2/3A, 2/3B, 3/4A, and 5/6, a model matrix according to each coding rate is stored in the memory.

TABLE 1

| Coding rate | Total nonzero weight at model matrix |
| --- | --- |
| 1/2 | 76 |
| 2/3A | 80 |
| 2/3B | 81 |
| 3/4A | 85 |
| 3/4B | 88 |
| 5/6 | 80 |

According to the related art, since a plurality of model matrixes are used, data retransmission cannot be performed in accordance with the IR method. If data retransmission is performed in accordance with the IR method, a coding rate during initial transmission is different from that during retransmission. To use different coding rates, encoding should be performed through different model matrixes. In other words, since a first model matrix used during initial transmission is different from a second model matrix used after reception of a NACK signal, a parity bit generated by the first model matrix becomes different from that generated by the second model matrix, thereby making combining reception in the receiver impossible.

DISCLOSURE OF THE INVENTION

Accordingly, the present invention is suggested to substantially obviate one or more problems due to limitations and disadvantages of the related art. An object of the present invention is to provide a method of encoding and decoding data using a small sized memory.

Another object of the present invention is to provide a parity check matrix which can variably support various coding rates and a method of encoding and decoding data using a low density parity check (LDPC) according to the parity check matrix.

Other object of the present invention is to provide a method of encoding/decoding data using LDPC, to which various retransmission methods such as ARQ and HARQ can be applied.

To achieve these objects and other advantages and in accordance with the purpose of the invention, as embodied and broadly described herein, a method encoding data by low density parity check (LDPC) code using a parity check matrix comprises encoding a first input data stream using a first sub-matrix of a parity check matrix including at least two sub-matrixes, and encoding a second input data stream using a second sub-matrix of the parity check matrix.

In another aspect of the present invention, a method of encoding data by low density parity check (LDPC) code using a parity check matrix comprises variably selecting a sub-matrix from a parity check matrix in accordance with a coding rate to be used for encoding, the parity check matrix including at least two sub-matrixes, and encoding an input data stream using the selected sub-matrix.

In still another aspect of the present invention, a method of transmitting data in a communication system comprises encoding an input data stream using a first sub-matrix of a parity check matrix including at least two sub-matrixes, transmitting a first data packet encoded by the first sub-matrix to a receiving side, receiving a negative reception acknowledgement (NACK) signal from the receiving side in response to the first data packet, encoding the input data stream using a second sub-matrix of the parity check matrix, and transmitting a second data packet encoded by the second sub-matrix to the receiving side.

In further still another aspect of the present invention, a method of transmitting data in a communication system comprises transmitting a first data packet encoded by a first sub-matrix of a parity check matrix to a receiving side, the parity check matrix including at least two sub-matrixes, receiving a retransmission request message for the first data packet from the receiving side, and transmitting a second data packet encoded by a second sub-matrix of the parity check matrix to the receiving side.

In further still another aspect of the present invention, a method of encoding by LDPC code using a parity check matrix comprises receiving codeword encoded by a specific sub-matrix variably selected from a parity check matrix in accordance with a coding rate to be used for encoding, the parity check matrix including at least two sub-matrixes, acquiring control information indicating the specific sub-matrix, and decoding the codeword by using the specific sub-matrix.

In further still another aspect of the present invention, a method of supporting data retransmission in a communication system comprises receiving a first data packet encoded by a first sub-matrix of a parity check matrix from a transmitting side, the parity check matrix including at least two sub-matrixes, transmitting a retransmission request message for the first data packet to the transmitting side when decoding of the first data packet is failed, and receiving a second data packet encoded by a second sub-matrix of the parity check matrix from the transmitting side.

In further still another aspect of the present invention, an encoder for encoding data by LDPC code comprises a memory module storing a parity check matrix including at least two sub-matrixes, and an encoding module encoding an input data stream by variably selecting a specific sub-matrix of the at least two sub-matrixes in accordance with a coding rate to be used for encoding.

BRIEF DESCRIPTION OF THE DRAWINGS

FIG. 7 is a diagram illustrating a concept of a sub-block on a parity check matrix;

FIG. 8 is a diagram illustrating an example of a model matrix suggested in the related art;

FIG. 9 is a diagram illustrating a concept of a model matrix expanded to a parity check matrix;

FIG. 13A and FIG. 13B are diagrams illustrating parity check matrixes according to still another embodiment of the present invention;

FIG. 14A to FIG. 14I are diagrams illustrating various model matrixes of a lower triangle type according to the embodiment of the present invention;

FIG. 16 is a diagram illustrating features of a parity check matrix used in the preferred embodiment of the present invention;

FIG. 18B is a diagram illustrating a parity part of a region 1901 of FIG. 18A;

FIG. 19 is a diagram illustrating an example of a model matrix according to another embodiment of the present invention;

FIG. 21A is a diagram illustrating an example of a parity check matrix of which last column has a weight of an even number;

FIG. 21B is a diagram illustrating an example of a parity check matrix of which last column has a weight of an odd number;

BEST MODE FOR CARRYING OUT THE INVENTION

Hereinafter, structures, operations, and advantages of the present invention will be understood readily by the preferred embodiments of the present invention, examples of which are illustrated in the accompanying drawings.

Hereinafter, a matrix which represents a parity check matrix by using a sub-block of a specific size of z×z depending on the aforementioned structured LDPC will be referred to as a model matrix. Each sub-block of the model matrix can be expanded to various kinds of models by a specific index. The model matrix uses an index as its element. Each sub-block of the model matrix can be determined by various methods depending on the index. Hereinafter, it is assumed that the index is a shift number of an identity matrix of a specific size (z×z). In other words, each sub-block is generated by shifting each row or column of a base matrix (for example, identity matrix) of z×z dimension in a certain direction. Each sub-block can be identified by the shifted number of each row or column. A method of generating each sub-block from the base matrix is not limited to shift of row or column. A sub-block having an index of '−1' is a zero matrix of a specific size (z×z).

The model matrix can be expanded to a specific parity check matrix depending on indexes. In other words, each index of the model matrix can be replaced with a sub-block depending on rules indicated by each index to generate a parity check matrix. In other words, performing encoding and decoding by using the model matrix means that encoding and decoding are performed by a specific parity check matrix generated by the model matrix.

First Embodiment

According to the aforementioned related art, in order to obtain an apparatus for encoding/decoding data, which supports a plurality of coding rates, model matrixes equivalent to the number of the supported coding rates are required. However, in this embodiment of the present invention, encoding and decoding are performed using one mother matrix.

The mother matrix could be a model matrix or a parity check matrix. Also, the parity check matrix may be generated by being expanded from a specific model matrix. Hereinafter, a method of performing encoding using a specific model matrix as a mother matrix will be described.

Figure 1:
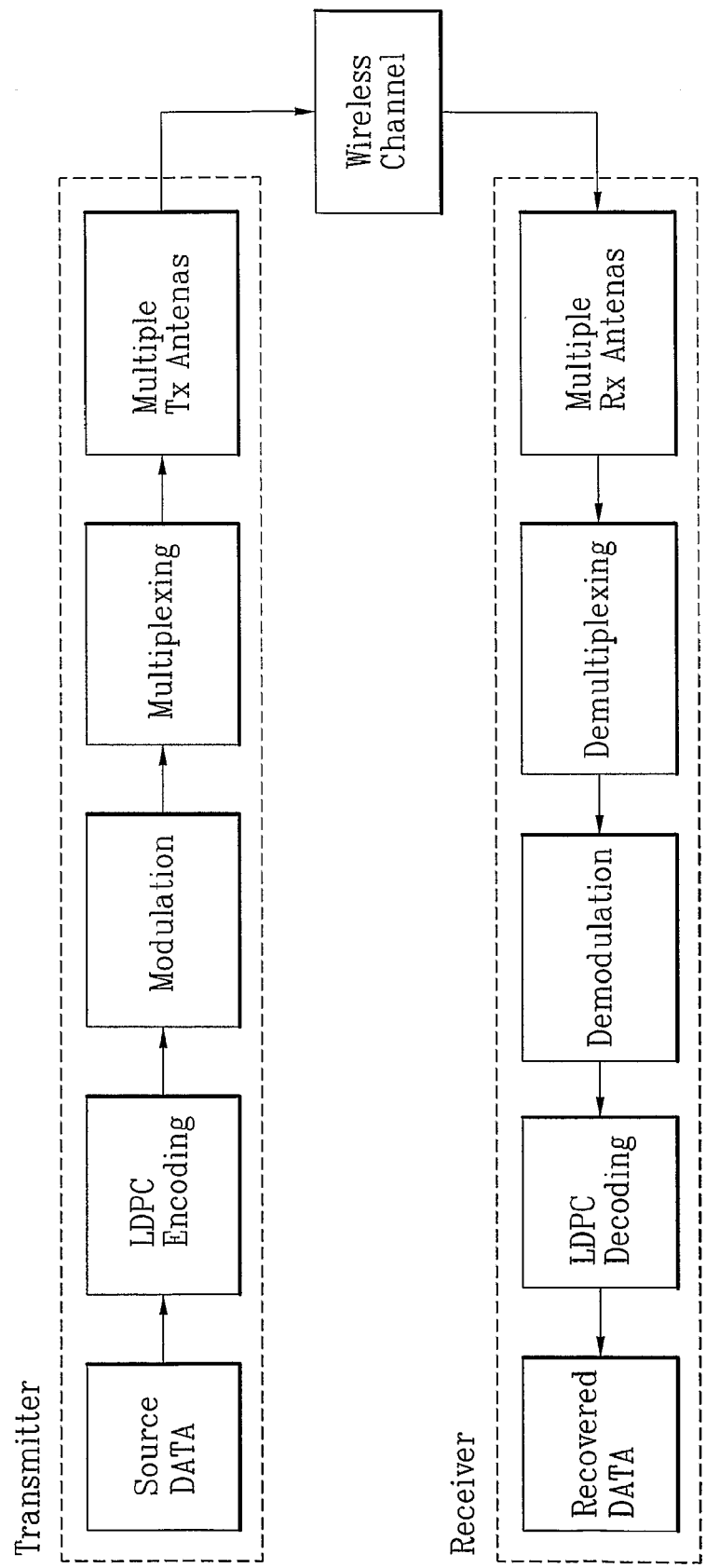
FIG. 1 is a block diagram illustrating a structure of a mobile communication channel to which the present invention and the related art are applied.
Figure 2:
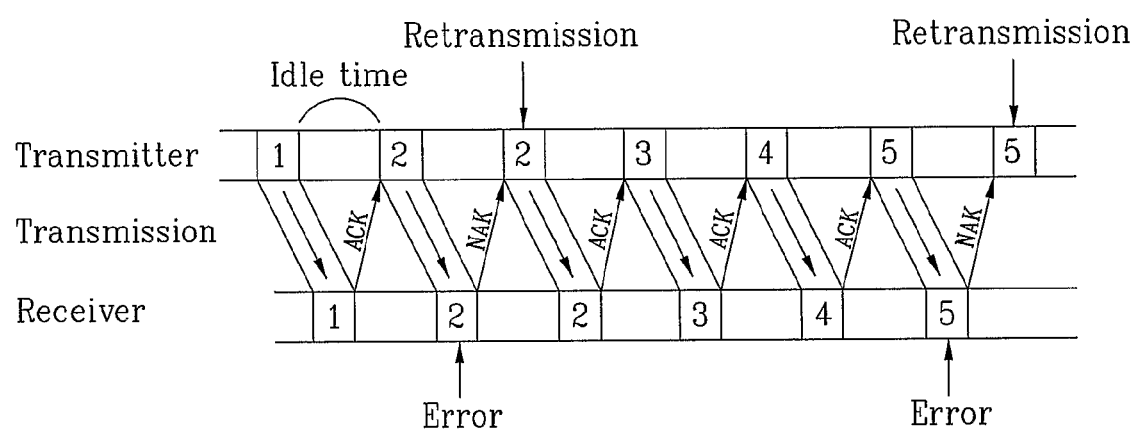
FIG. 2 to FIG. 4 are diagrams illustrating a retransmission method according to the related art.
Figure 3:
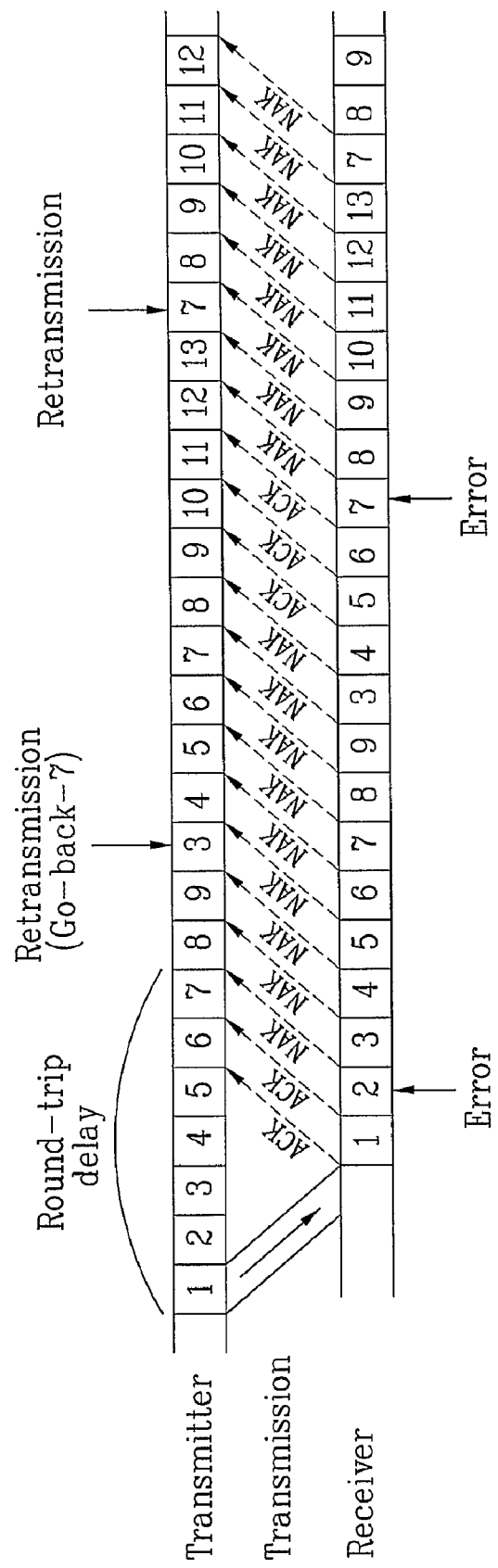
Figure 4:
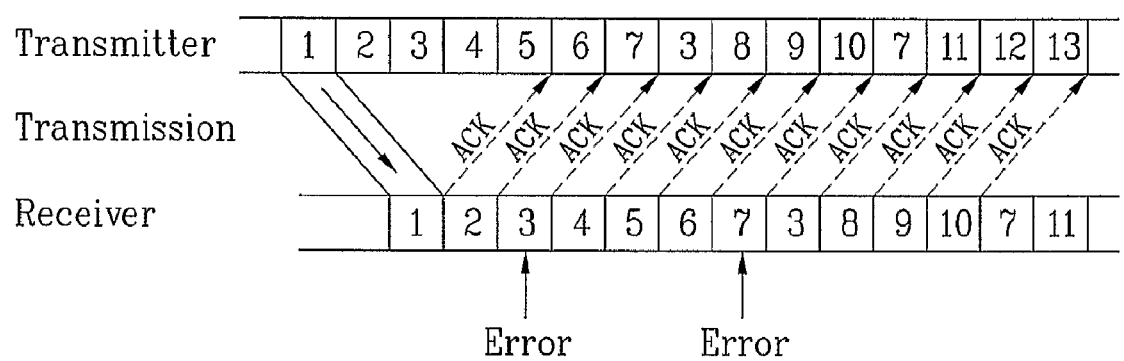
Figure 5:
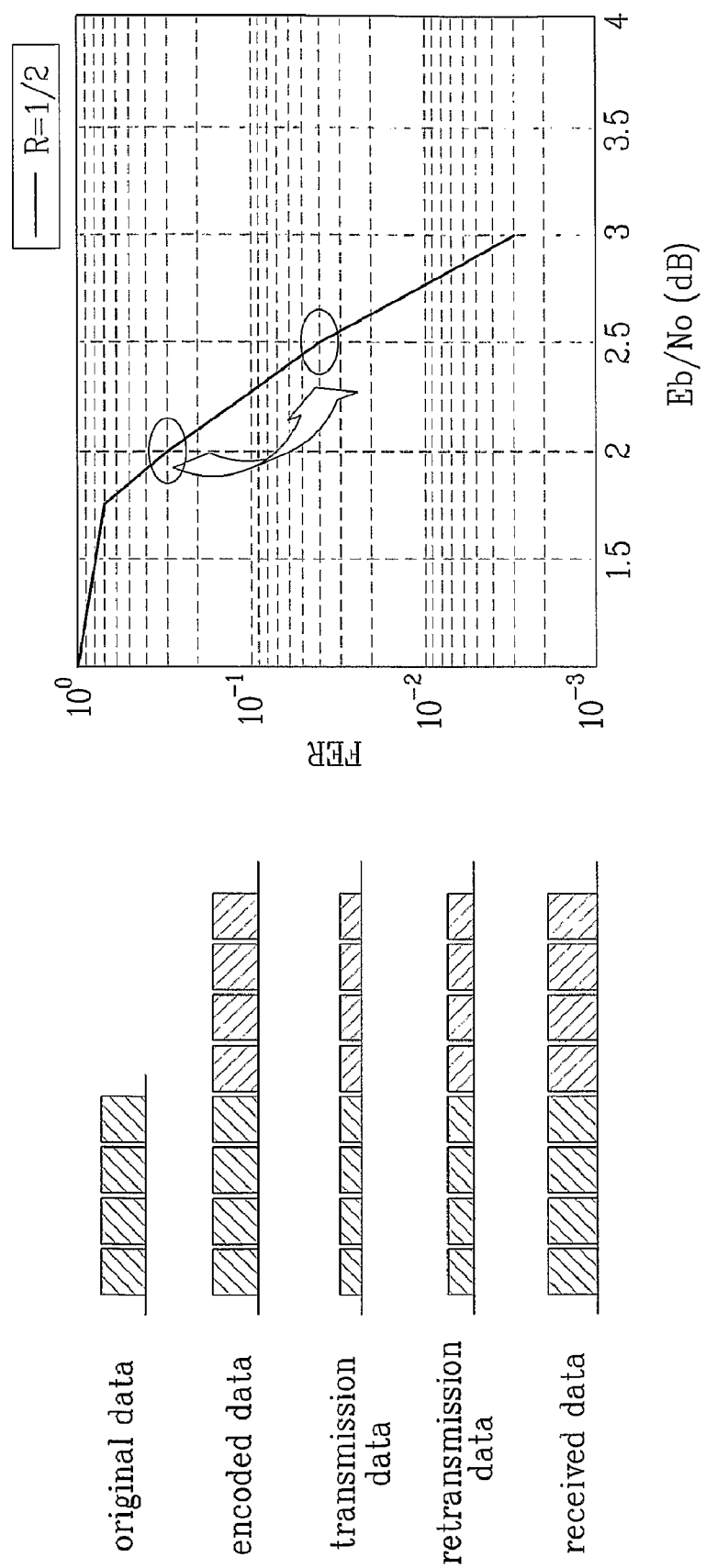
FIG. 5 and FIG. 6 are diagrams illustrating a retransmission method according to the related art and the present invention.
Figure 6:
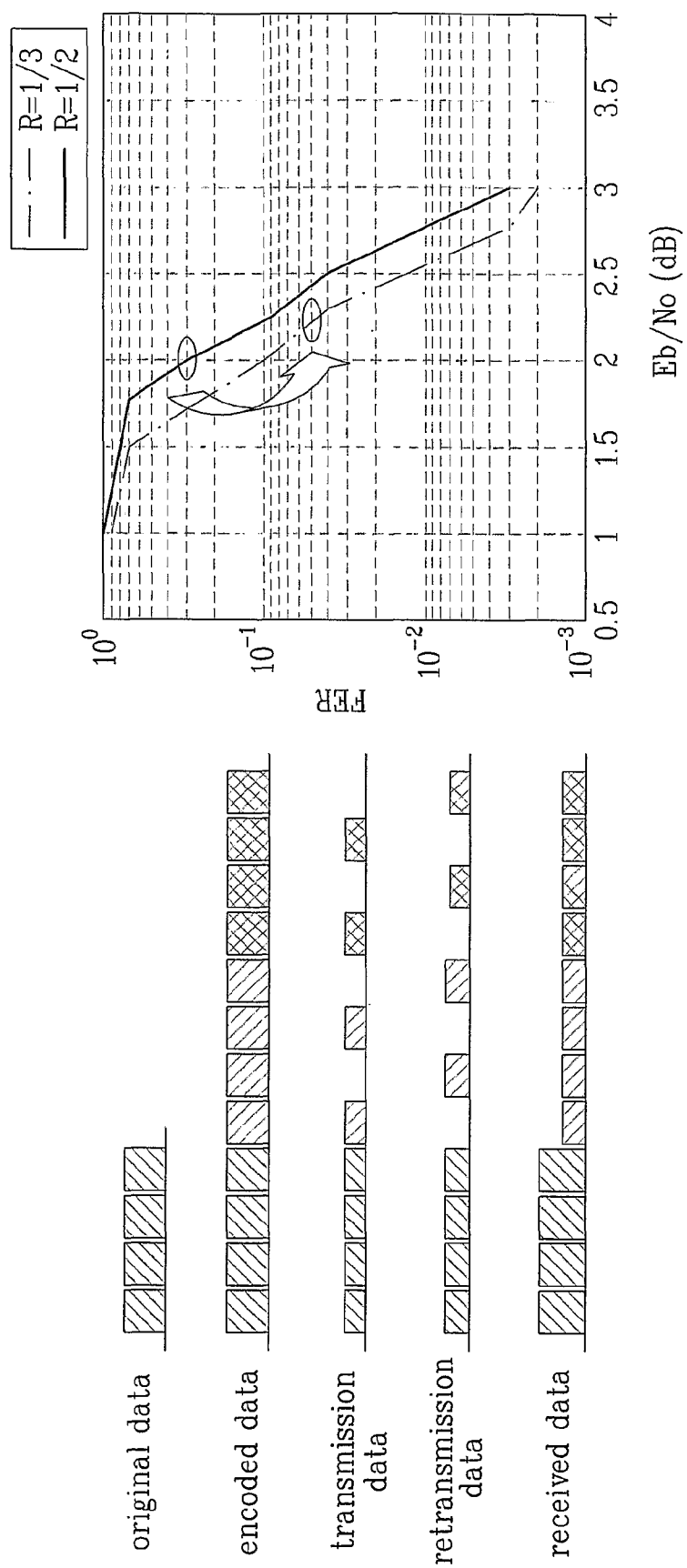
Figure 10:
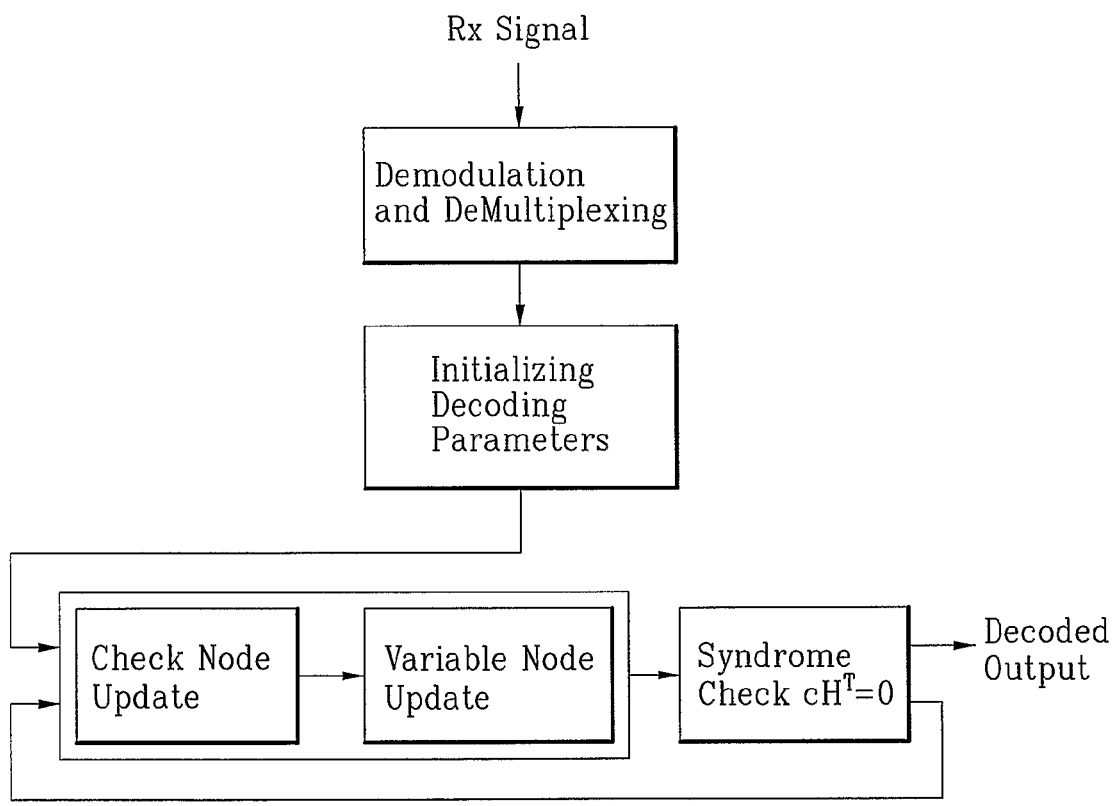
FIG. 10 is a diagram illustrating a method of decoding data using LDPC according to the related art and the present invention.
Figure 11:
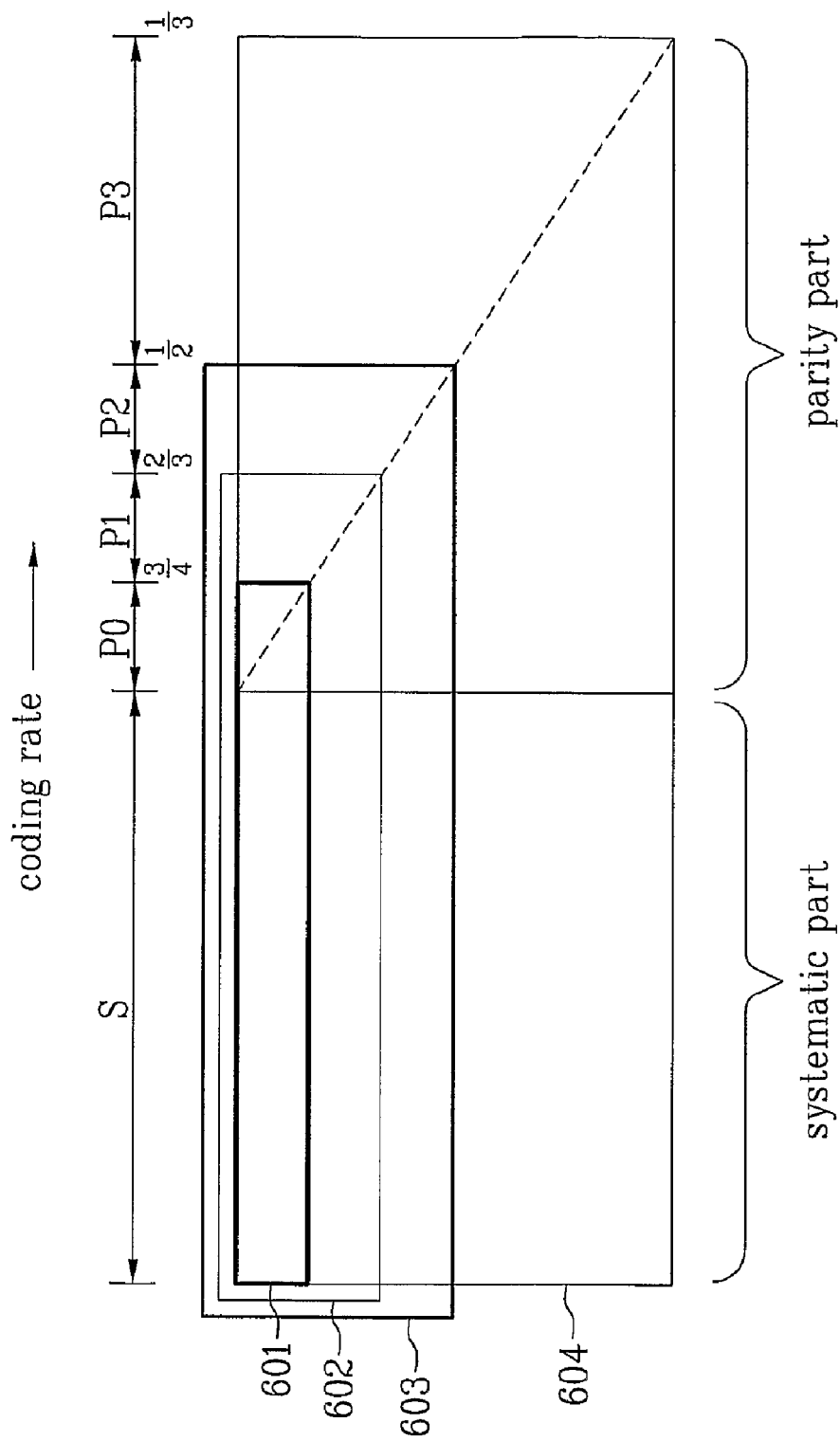
FIG. 11 is a diagram illustrating a concept of a parity check matrix according to one embodiment of the present invention.

FIG. 11 is a diagram illustrating a concept of a parity check matrix which supports a plurality of coding rates through one mother matrix in accordance with one embodiment of the present invention. If it is assumed that a model matrix of FIG. 11 is $H_b$, the $H_b$ consists of a systematic part $H_{b1}$ and a parity part $H_{b2}$, wherein the systematic part corresponds to information bits, one to one. The model matrix can be expressed by the following equation.

$$H_b = [(H_{b1})_{m_b \times k_b} | (H_{b2})_{m_b \times m_b}]$$ [Equation 5]

The $m_b$ represents the number of sub-blocks located in the model matrix of FIG. 11 in a column direction. Also, $k_b$ represents a value obtained by subtracting the $m_b$ from the number $n_b$ of sub-blocks located in a row direction of the model matrix. In other words, the systematic part of the model matrix has a size of $m_b \times k_b$ in case of a unit of a sub-block. Also, the parity part of the model matrix has a size of $m_b \times m_b$ in case of a unit of a sub-block. A coding rate R is determined by the size of the model matrix, i.e., $R = k_b/(k_b + m_b)$.

In the example of FIG. 11, a coding rate by the mother matrix 604 is 1/3, and sub-matrixes of the mother matrix 604 are located in a region 601, a region 602, and a region 603. Each of the sub-matrixes is a part of the mother matrix, and is configured as shown in the example of FIG. 11. In other words, the information bits encoded by the sub-matrixes 601, 602 and 603 have the same length as that of the information bits encoded by the mother matrix 604. The sub-matrixes are different from one another in their sizes and have unique coding rates depending on their sizes. For example, the first sub-matrix 601 has a coding rate of 3/4, the second sub-matrix 602 has a coding rate of 2/3, and the third sub-matrix 603 has a coding rate of 1/2. Also, a sub-matrix which generates a codeword having a lower coding rate includes a sub-matrix which generates a codeword having a higher coding rate. The mother matrix according to this embodiment is characterized in that it includes at least one sub-matrix.

In this embodiment, encoding or decoding is performed using the aforementioned mother matrix. In this case, encoding or decoding by a part of the mother matrix or the entire mother matrix is performed. In other words, encoding or decoding is performed by the mother matrix or at least one sub-matrix to support a plurality of coding rates. For example, an encoder provided in a transmitter can perform encoding by storing the mother matrix in a memory and reading entire or a part of the mother matrix depending on a desired coding rate. Also, a decoder provided in a receiver can perform decoding by storing the mother matrix in its memory and reading entire or a part of the mother matrix depending on the coding rate used in the transmitter. In other words, although different model matrixes are conventionally stored in the memory depending on each coding rate, if encoding and decoding are performed using the mother matrix suggested in this embodiment of the present invention, entire or some regions of one mother matrix are used. Thus, various kinds of coding rates can be supported with a small sized memory.

If encoding and decoding are performed by the mother matrix according to this embodiment of the present invention, it is preferably required to change a structure of the systematic part of the mother matrix. Hereinafter, a design of the systematic part of the mother matrix will be described.

Figure 12A:
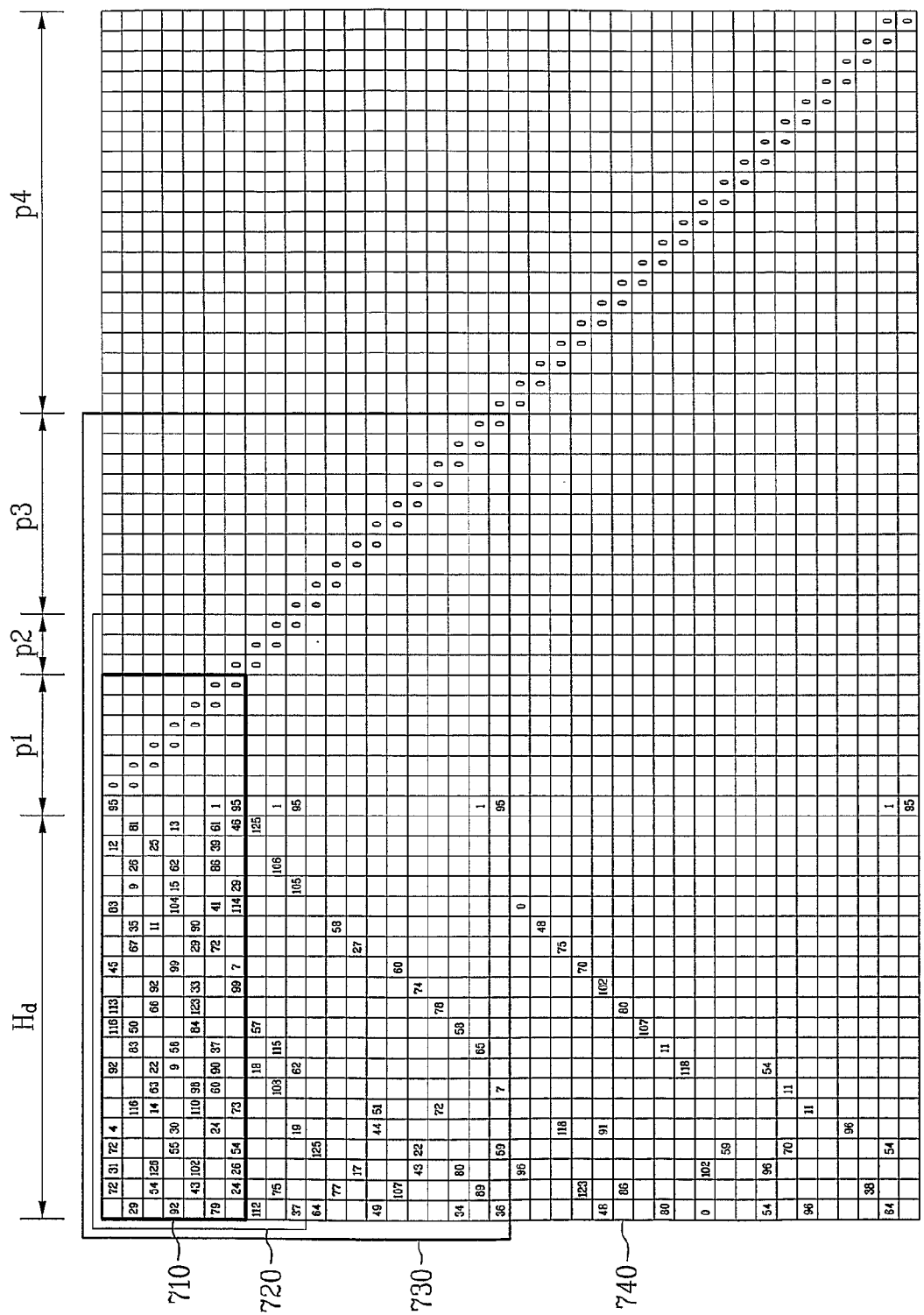
FIG. 12A and FIG. 12B are diagrams illustrating parity check matrixes according to another embodiment of the present invention.

FIG. 12A is a diagram illustrating the mother matrix according to the preferred embodiment of the present invention in a form of a model matrix. The mother matrix includes three sub-matrixes, and four different coding rates are supported by the mother matrix. The sub-matrixes are determined depending on the coding rate. The first sub-matrix 710 supports a coding rate of 20/27, the second sub-matrix 720 supports a coding rate of 2/3, the third sub-matrix 730 supports a coding rate of 1/2, and the mother matrix 740 supports a coding rate of 1/3.

In FIG. 12A, sub-blocks marked with '0' represent identity matrixes of z×z, and sub-blocks marked with nothing represent zero matrixes of z×z. A positive integer is an index and indicates a sub-block generated by shifting each row or column of the identity matrix in accordance with a predetermined rule. For example, if a permutation matrix is generated by shifting each row of the identity matrix to the right, the respective positive integer identify a permutation matrix generated by shifting each row of the identity matrix to the right as much as the positive integer. In other words, if the positive index is '3', the matrix represents a permutation matrix in which each row of the identity matrix is shifted to the right three times.

Weight density for a row or column in the systematic part of each sub-matrix is preferably determined by each sub-matrix. 'Weight' means the number of non-zero elements which are not '0', i.e., the number of '1' in a specific row or column if the model matrix is expanded to a parity check matrix. Also, the weight density represents a rate between non-zero elements and entire elements in a specific row or column. In more detail, it is preferable that the weight density of row or column for the systematic part of the first sub-matrix 710 is the highest. It is preferable that the weight density of row or column for the systematic part of the second sub-matrix 720 is the second highest. It is also preferable that the weight density of row or column for the systematic part of the third sub-matrix 730 is the third highest. It is also preferable that the weight density of row or column for the systematic part of the mother matrix 740 is the lowest.

In other words, the weight density of row or column for the systematic part of the mother matrix 740 is preferably determined differently depending on the systematic part determined depending on the coding rate. Also, it is more preferable that the weight density of row or column for the systematic part which supports a high coding rate is greater than the weight density of row or column for the systematic part which supports a low coding rate.

Figure 12B:
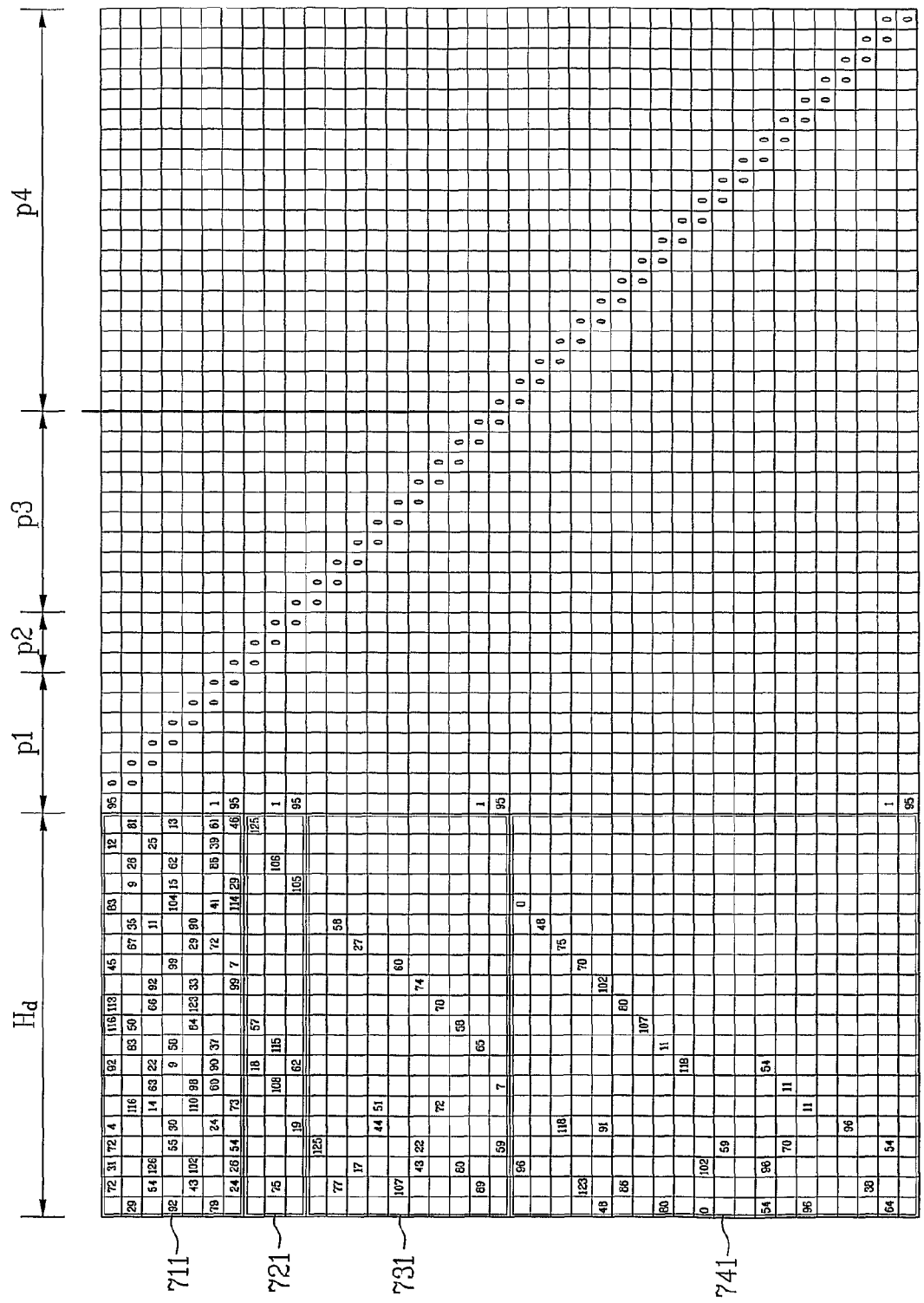

The weight density for the systematic part of the mother matrix or the sub-matrix suggested in this embodiment of the present invention can be arranged as shown in FIG. 12B. In other words, the first sub-matrix 711 corresponding to the highest coding rate, the second sub-matrix 721 corresponding to the second highest coding rate, the third sub-matrix 731 corresponding to the third highest coding rate, and the fourth sub-matrix 741 corresponding to the lowest coding rate can be arranged. In this embodiment of the present invention, each weight density is preferably provided for each of the sub-matrixes 711, 721, 731 and 741. In other words, the weight density of any one of the four sub-matrixes may be the highest while the weight density of the other three sub-matrixes may be lower. Also, the weight density of any two of the four sub-matrixes may be higher while the weight density of the other two sub-matrixes may be lower. Preferably, the weight density may be determined depending on the order of the sub-matrix corresponding to the high coding rate. In other words, the weight density of the first sub-matrix 711 may be the highest, the weight density of the second sub-matrix 721 may be the second highest, the weight density of the third sub-matrix 731 may be the third highest, and the weight density of the fourth sub-matrix 741 may be the lowest.

Table 2 illustrates the weight density according to the example of FIG. 12A and FIG. 12B. Table 2 represents an average row weight value of the systematic part of the mother matrix or the sub-matrix. The average row weight value represents an average value of sum of weight values included in rows. In other words, the average row weight value is a data value corresponding to the weight density of the row or column.

TABLE 2

| Coding rate | Average row weight | Average row weight (%) | Remarks |
|---|---|---|---|
| 20/27 | 11.43 | 100% | High coding rate |
| 2/3 | 9.90 | 86.6% | High coding rate |
| 1/2 | 7.75 | 67.8% | Low coding rate |
| 1/3 | 6.20 | 54.2% | Low coding rate |

If the coding rate is 20/27, each row includes an average non-zero weight of 11.43. Also, if the coding rate is 2/3, each row includes an average non-zero weight of 9.90, wherein each row has a weight of 86.6% in comparison with a coding rate of 20/27. Furthermore, if the coding rate is 1/2, each row includes an average non-zero weight of 7.75, wherein each row has a weight of 67.8% in comparison with a coding rate of 20/27. Furthermore, if the coding rate is 1/3, each row includes an average non-zero weight of 6.20, wherein each row has a weight of 54.2% in comparison with a coding rate of 20/27.

As will be aware of it through Table 2, the weight density for the sub-matrix which supports a high coding rate is relatively high. In other words, the weight is dense in the sub-matrix which supports a high coding rate. On the other hand, the weight density of the sub-matrix which supports a low coding rate is relatively low. In other words, the weight is sparse in the sub-matrix which supports a low coding rate.

If encoding is performed using the model matrix of FIG. 12A and FIG. 12B, since various kinds of coding rates can be supported using one mother matrix, the mother matrix according to this embodiment of the present invention can be applied to various systems. A method of supporting various coding rates requested by one mother matrix in a system which requires rate compatibility will now be described in brief.

First, since communication of a high coding rate can be performed in case of good channel environment, if a coding rate of 20/27 is used, encoding is performed using the first sub-matrix 710. Also, the receiver stores the mother matrix the same as that of the transmitter in its memory or the like, and performs decoding of codeword ($H_d$, p1) by using the first sub-matrix 710.

If a coding rate lower than a previous coding rate, for example, a coding rate of 2/3 is used due to change of the channel environment, encoding is performed using the second sub-matrix 720. The receiver stores the mother matrix the same as that of the transmitter in the memory or the like, and performs decoding of codeword ($H_d$, p1, p2) by using the second sub-matrix 720.

If a coding rate lower than a previous coding rate, for example, a coding rate of 1/2 is used due to change of the channel environment, encoding is performed using the third sub-matrix 730. The receiver stores the mother matrix the same as that of the transmitter in the memory or the like, and performs decoding of codeword ($H_d$, p1, p2, p3) by using the third sub-matrix 730.

If a coding rate lower than a previous coding rate, for example, a coding rate of 1/3 is used due to change of the channel environment, encoding is performed using the mother matrix 740. The receiver stores the mother matrix the same as that of the transmitter in the memory or the like, and performs decoding of codeword ($H_d$, p1, p2, p3, p4) by using the mother matrix 740.

The aforementioned coding rates, the sizes of the matrixes, and weight features are only exemplary to describe the present invention, and the present invention is not limited to the aforementioned numerical values. In other words, the above conditions such as the coding rates may freely be changed.

Figure 13A:
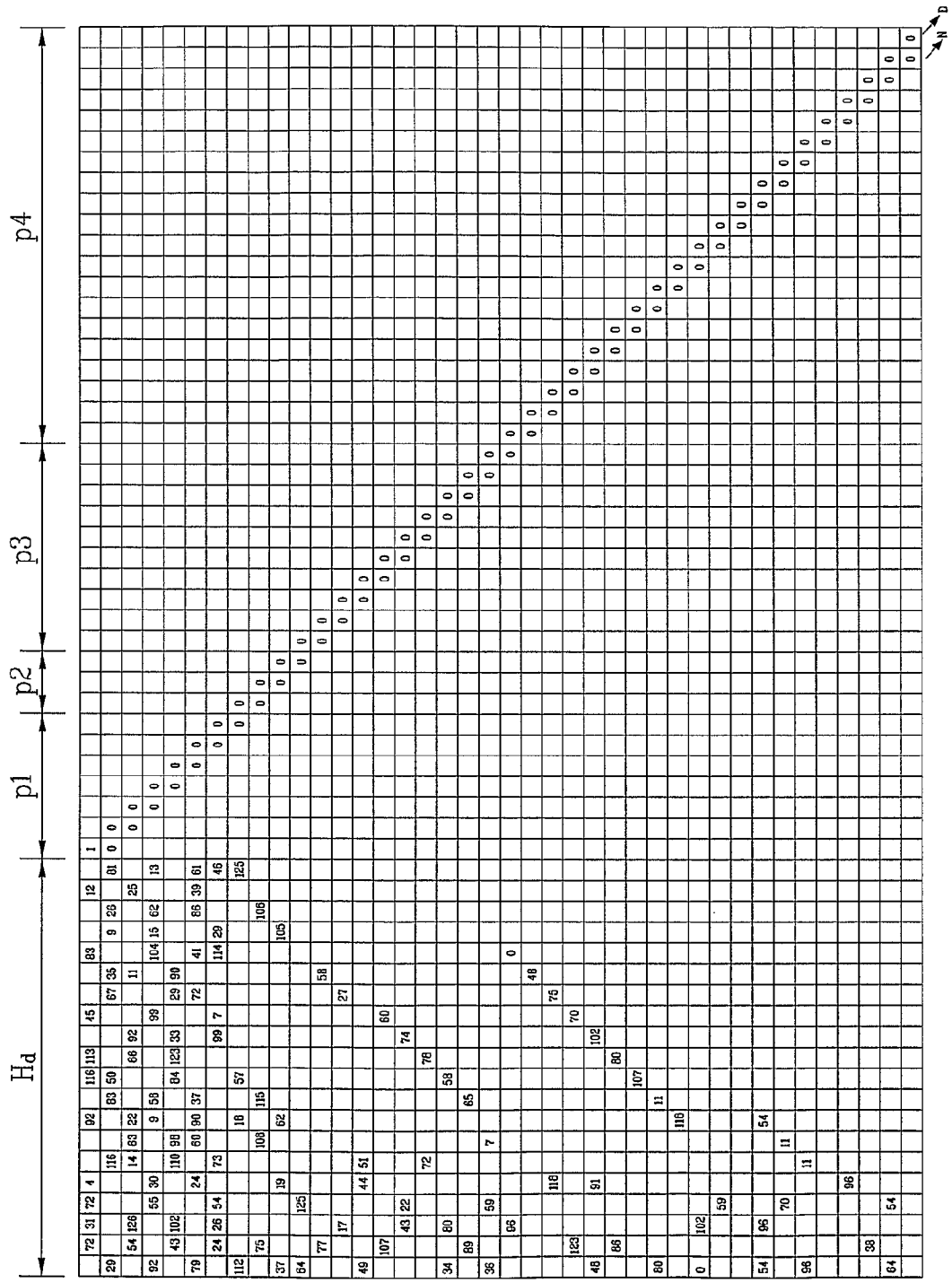
Figure 13B:
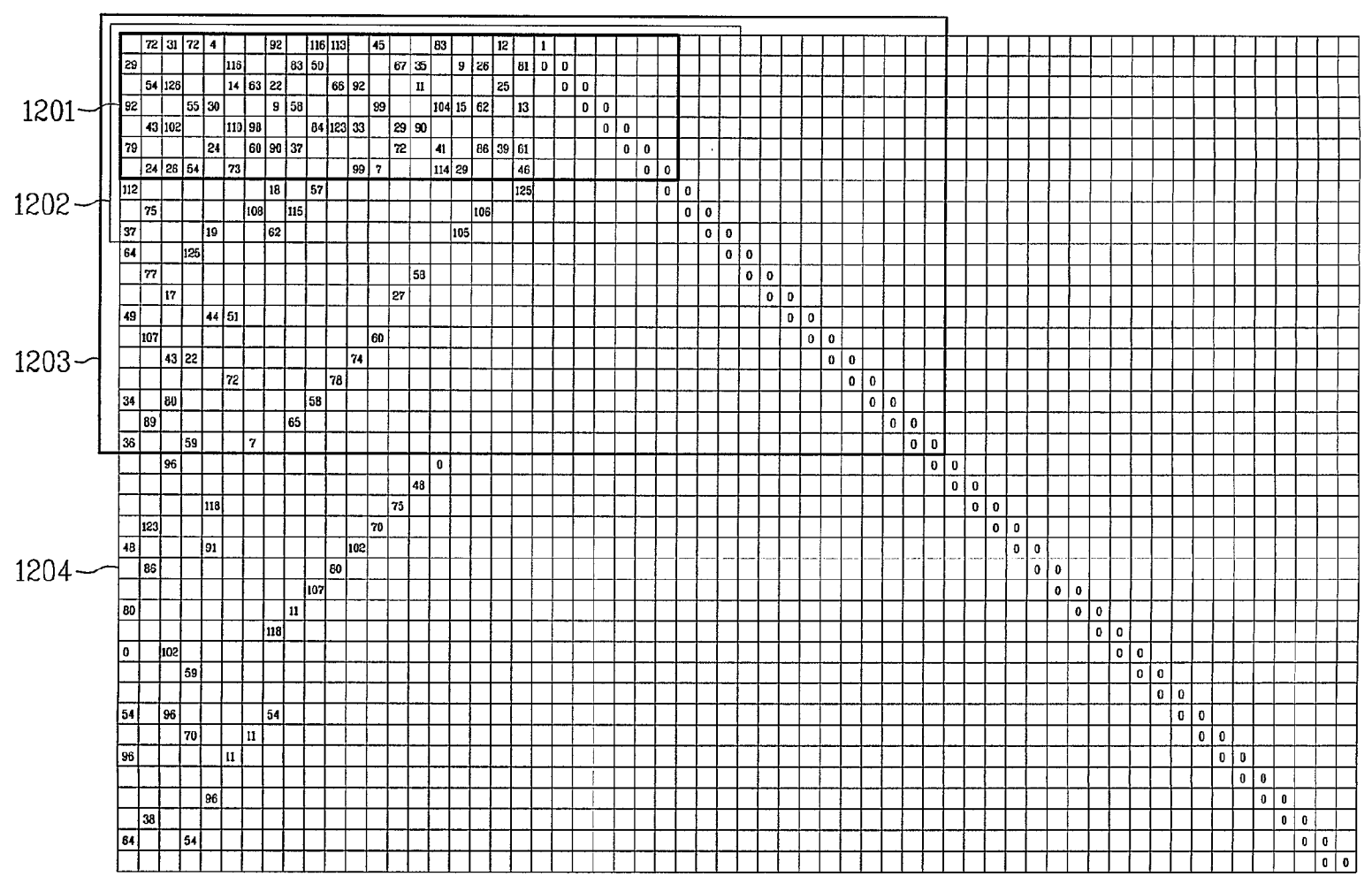

FIG. 13A and FIG. 13B are diagrams illustrating parity check matrixes according to another embodiment of the present invention, especially a mother matrix to which HARQ method can be applied.

The mother matrix suggested in the embodiment of FIG. 13A and FIG. 13B has a lower triangle type. Hereinafter, the lower triangular type will be described. Various model matrixes suggested in the embodiment of the present invention have dual diagonal elements in a parity part. The dual diagonal elements according to the present invention consist of one diagonal element D and another diagonal element N adjacent to the diagonal element D as shown. The adjacent diagonal element N is located to be lower than the diagonal element. In other words, the adjacent diagonal element is located at the left of the diagonal element. Lower and upper elements and left and right elements of the matrix are variable depending on a viewing direction of the matrix. The mother matrix according to the embodiments of the present invention will be described below in view of another aspect.

Assuming that a specific model matrix is [$H_d$:$H_p$], a row of a sub-block in the parity part of the model matrix is r, a column thereof is indexed as c, and the number of shifts for a specific sub-block is $A_{r,c}$, the index $A_{r,c}$ has a random integer not '−1' in case of r=c and r=c+1. In other words, if the parity part of the specific model matrix has 16 sub-blocks, the parity part is determined as shown in Equation 6 below.

$$\begin{pmatrix} A_{0,0}=x_1 & A_{0,1}=-1 & A_{0,2}=-1 & A_{0,3}=-1 \\ A_{1,0}=x_2 & A_{1,1}=x_3 & A_{1,2}=-1 & A_{1,3}=-1 \\ A_{2,0}=y_1 & A_{2,1}=x_4 & A_{2,2}=x_5 & A_{2,3}=-1 \\ A_{3,0}=y_2 & A_{3,1}=y_3 & A_{3,2}=x_6 & A_{3,3}=x_7 \end{pmatrix}$$ [Equation 6]

In the above equation, $x_i$ and $y_i$ represent random positive integers. Since the parity part of the model matrix or the parity check matrix can be arranged variously depending on a design method of the dual diagonal elements, the mother matrix of FIG. 13A can be identified that it has been designed in accordance with the lower triangle type.

FIG. 14A to FIG. 14I illustrate various model matrixes according to the low triangle type. In the model matrix of FIG. 14A to FIG. 14I, x_1 to x_21, y_1 to y45, and z1 to z55 represent random shift numbers. Since the x_1 to x_21 are dual diagonal elements, they may have various shift numbers excluding '−1' which means a zero matrix. Also, since the systematic part ($H_d$-part) of the model matrix of FIG. 14A to FIG. 14I may have various shift numbers, display of the shift numbers will be omitted.

Figure 14A:
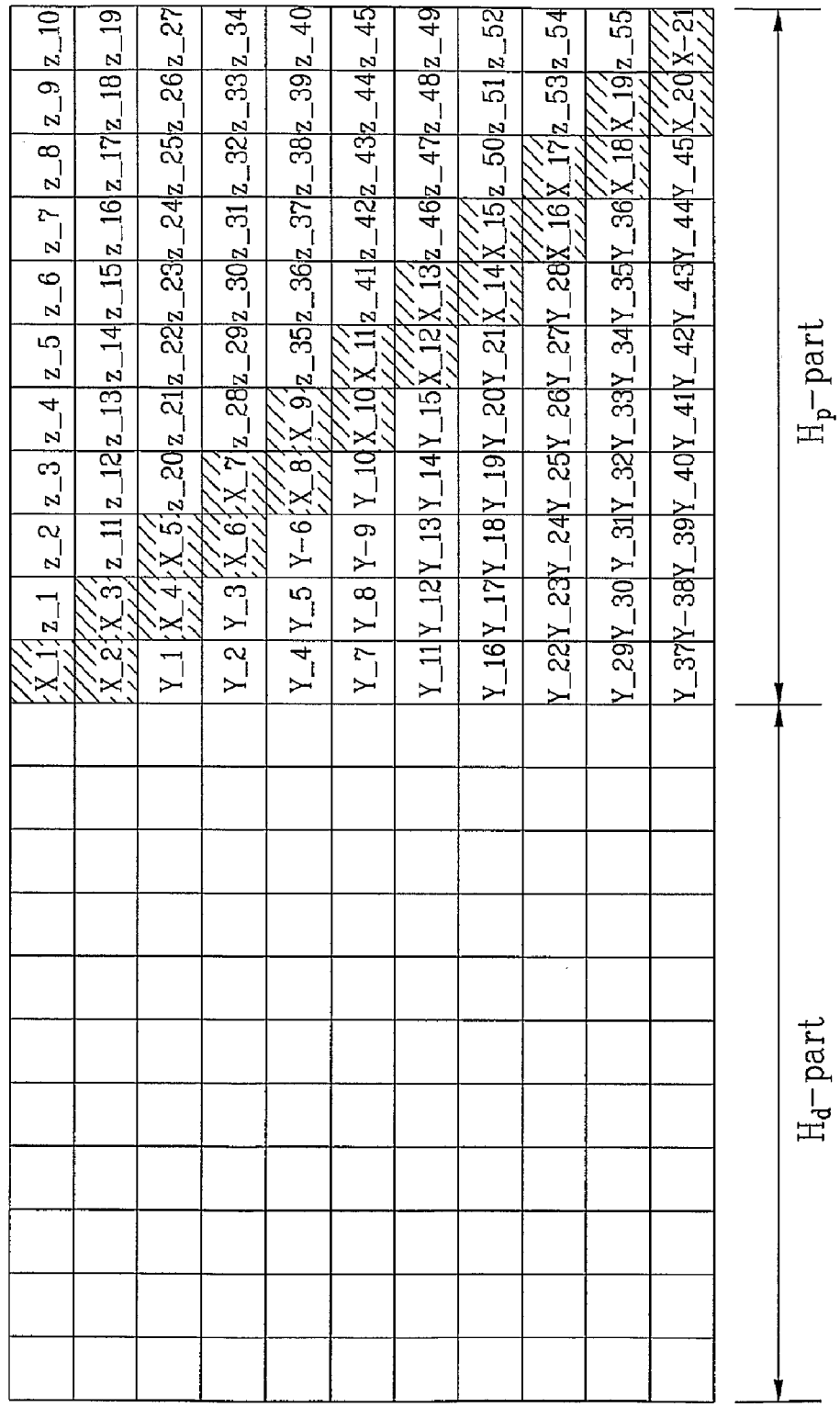
Figure 14C:
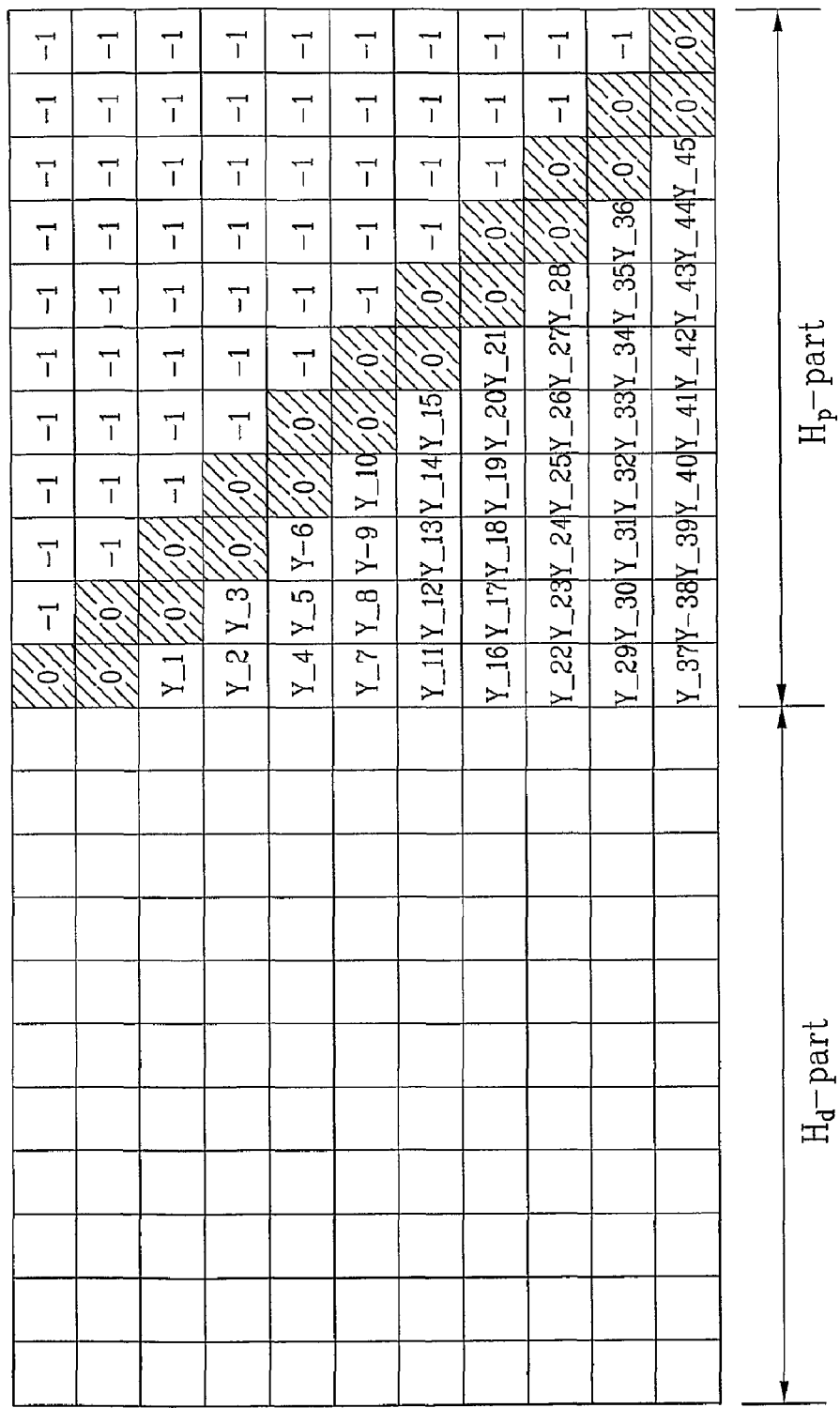
Figure 14D:
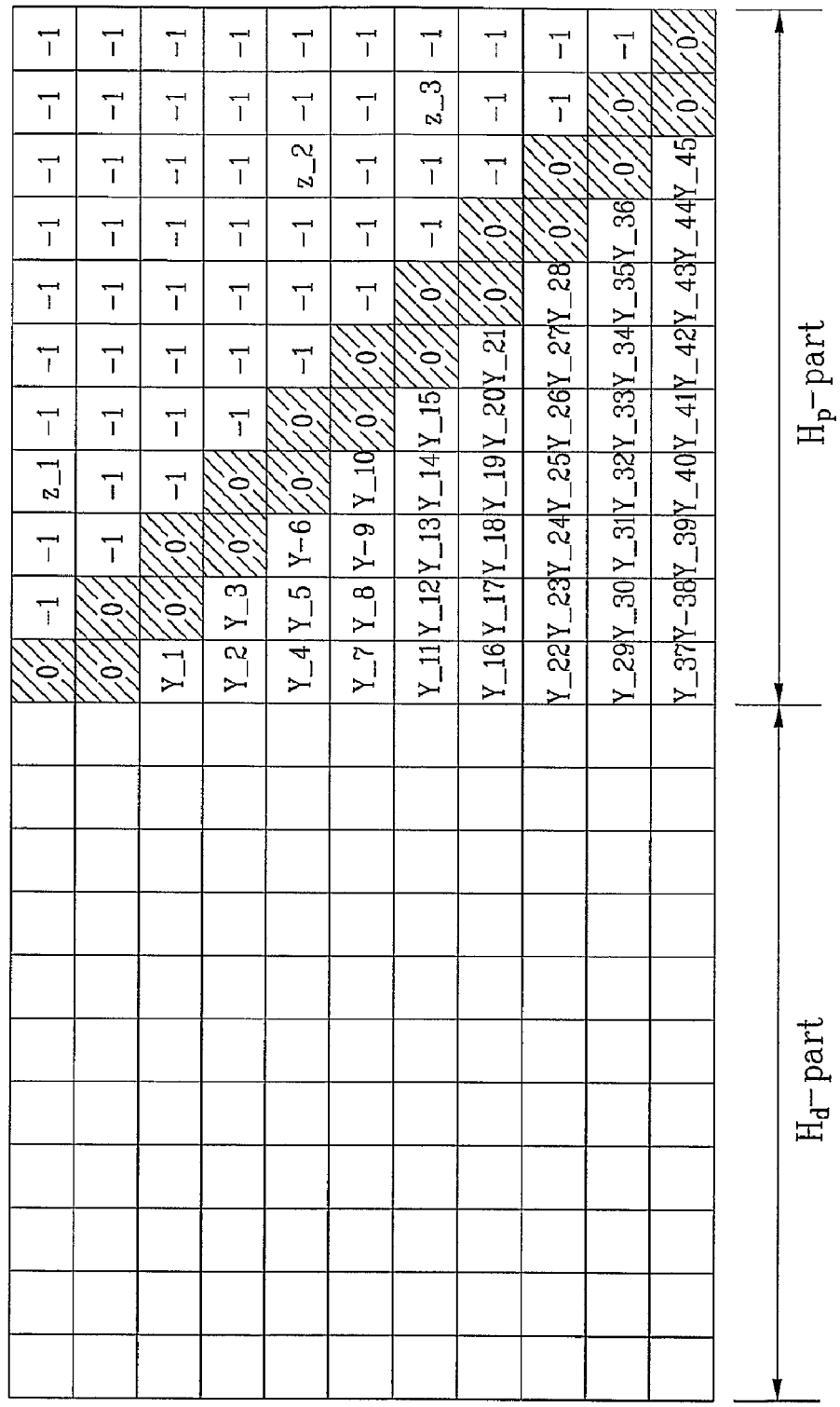
Figure 14E:
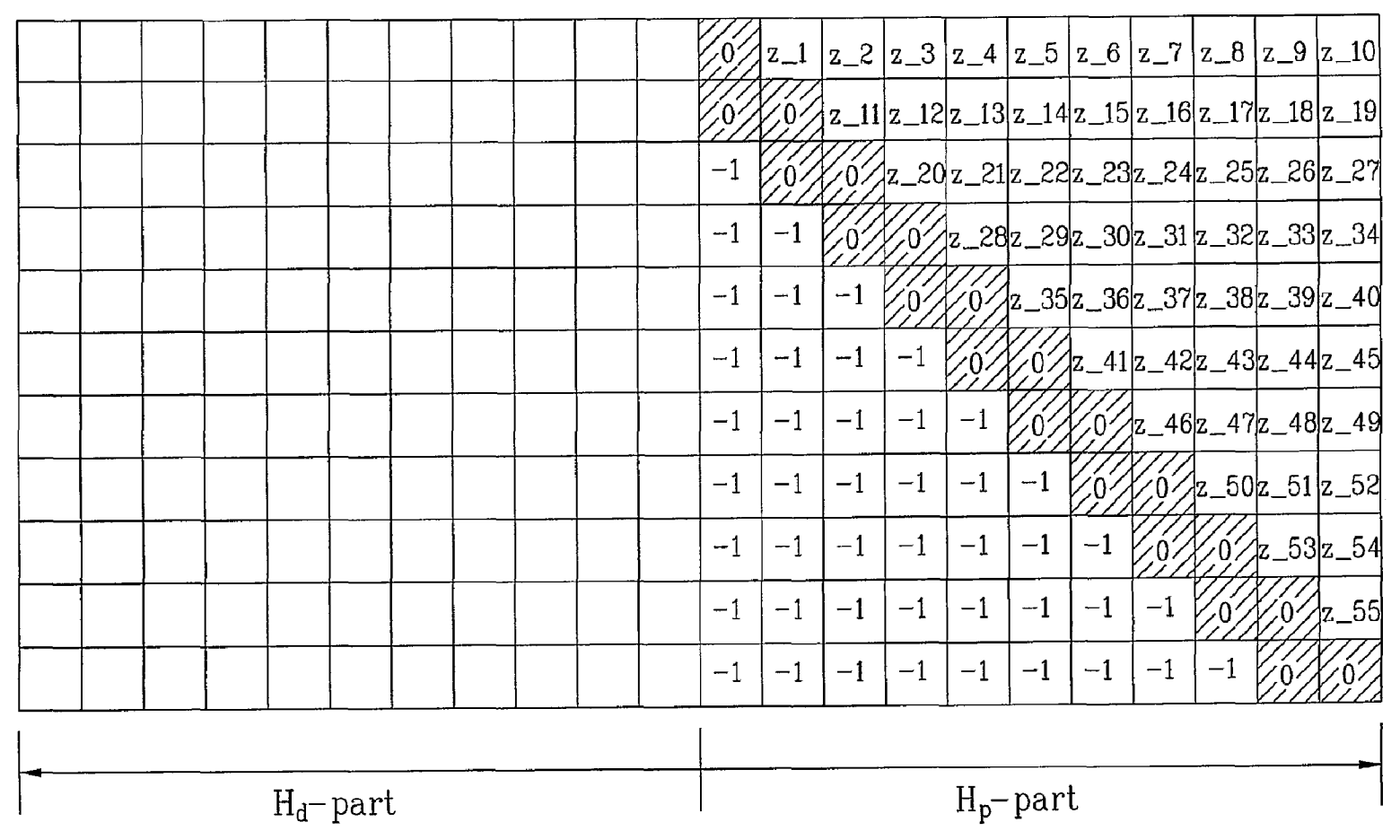
Figure 14G:
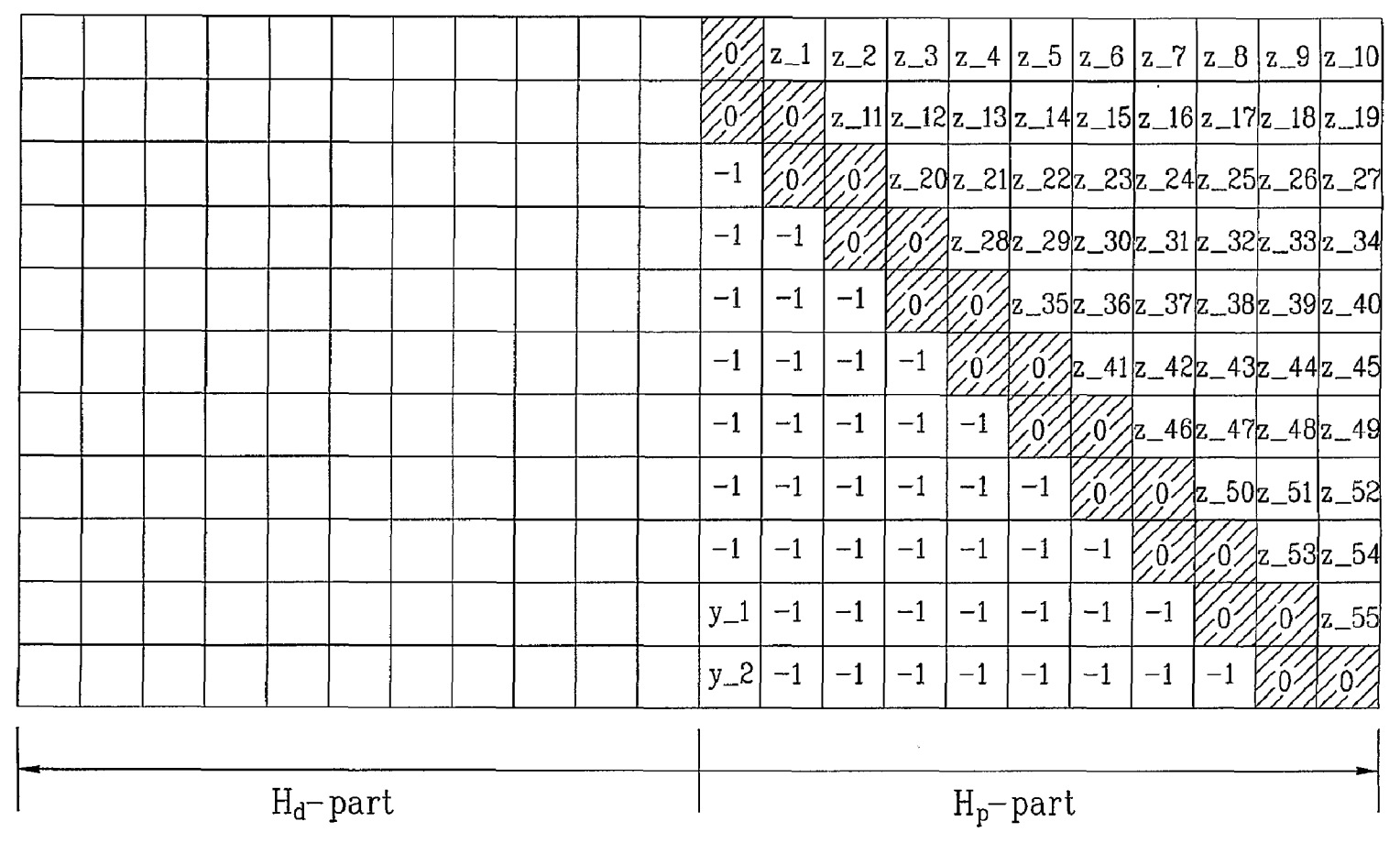
Figure 14H:
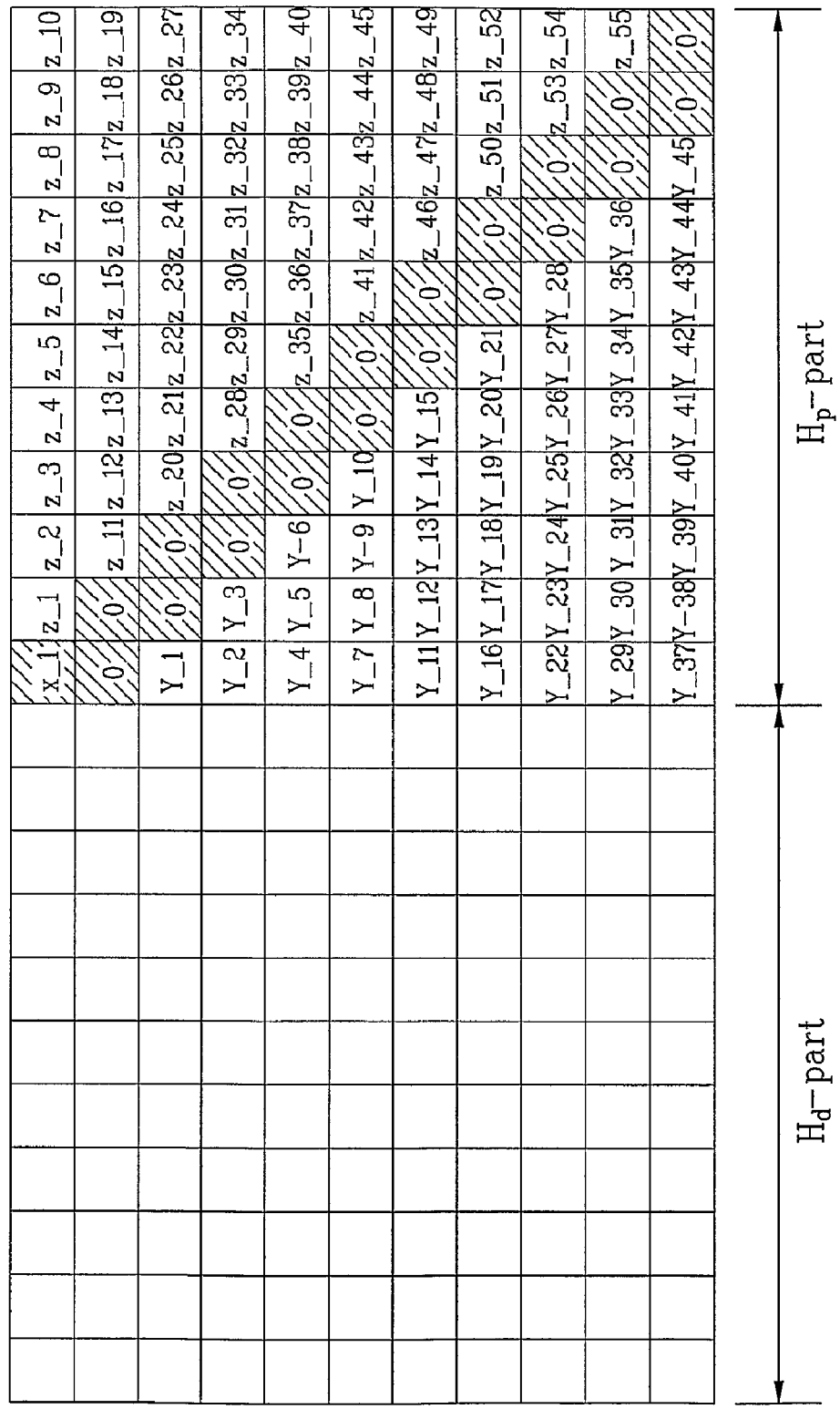
Figure 14I:
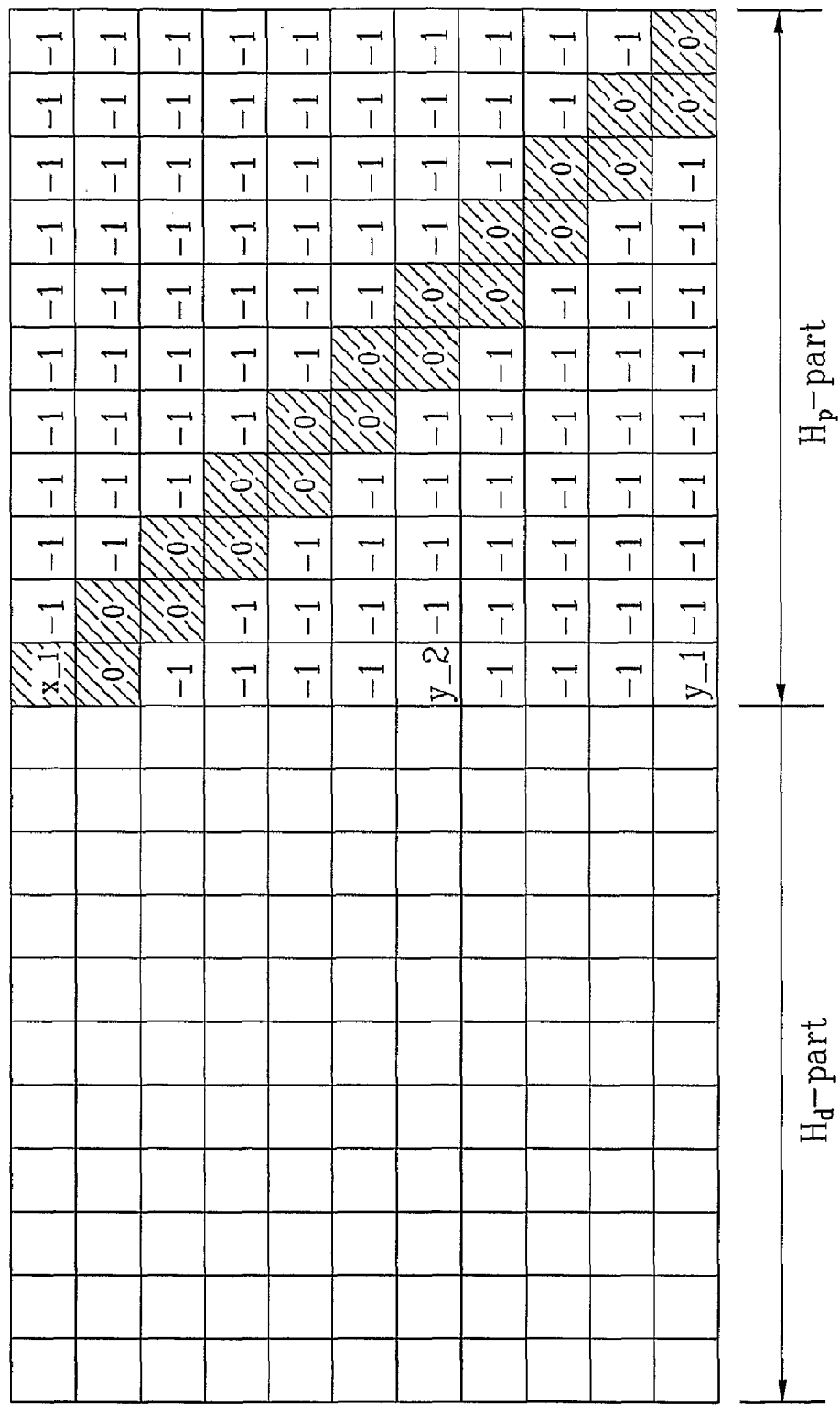

As shown in FIG. 14A, the dual diagonal elements of the model matrix and the other elements except for the dual diagonal elements may have the same value or different values. Also, as shown in FIG. 14B, the dual diagonal elements of the model matrix designed in accordance with the lower triangle type could be shift numbers of '0'. As shown in FIGS. 14C and 14D, the elements located above the dual diagonal elements of the model matrix designed in accordance with the lower triangle type could be shift numbers of '−1' corresponding to a zero matrix. However, as shown in FIG. 14D, the model matrix designed in accordance with the lower triangle type may include a specific number of elements z1, z2, z3 not '−1.' FIG. 14E illustrates another example of the model matrix designed in accordance with the lower triangle type. As shown, the elements located below the dual diagonal elements could be shift numbers of '−1' corresponding to a zero matrix. Also, as shown in FIG. 14F and FIG. 14G, some of the elements located below the dual diagonal elements could be elements y_1 not '−1'. FIG. 14H and FIG. 14I illustrate another example of the model matrix designed in accordance with the lower triangle type. As shown, the element x_1 of the model matrix designed in accordance with the lower triangle type could be a random element not '0' and '−1,' and a specific number of elements located in the same column as that of the random element could be random elements not '−1.' The location and number of the elements not '−1', which are located in the same column as that of the dual diagonal elements not '0' can be determined variously. In other words, the location and number of the elements not '−1' can have various values depending on the encoder which generates parity bits or the structure of the systematic part of the model matrix.

The mother matrix suggested in the present invention is classified depending on a plurality of regions, and systematic parts of the respective regions preferably have different weight densities.

First, the plurality of regions provided in the mother matrix will be described.

In the example of FIG. 13B, a coding rate of the mother matrix 1204 is 1/3, and sub-matrixes of the mother matrix 1204 are located in the regions 1201, 1202 and 1203. A sub-matrix is a region of the mother matrix, and is configured as shown in FIG. 13B. In other words, information bits encoded by the regions 1201, 1202 and 1203 has the same length as that of information bits encoded by the mother matrix 1204. The sub-matrixes are different from one another in their sizes and have unique coding rates depending on their sizes. For example, the first sub-matrix 1201 has a coding rate of about 3/4 (exactly, 20/27), the second sub-matrix 1202 has a coding rate of 2/3, and the third sub-matrix 1203 has a coding rate of 1/2. Also, a sub-matrix which generates a codeword having a lower coding rate includes a sub-matrix which generates a codeword having a higher coding rate. The mother matrix according to this embodiment is characterized in that it includes at least one sub-matrix. Although the mother matrix is divided into four regions for convenience of description in this embodiment, there is no limitation in the number of the divided regions.

In this embodiment of the present invention, encoding/decoding is performed using the aforementioned mother matrix. In this case, encoding/decoding is performed by entire or a part of the mother matrix. In other words, encoding/decoding is performed by the mother matrix or at least one sub-matrix to support a plurality of coding rates. For example, an encoder provided in a transmitter can perform encoding by storing the mother matrix in a memory and reading entire or a part of the mother matrix depending on a desired coding rate. Also, a decoder provided in a receiver can perform decoding by storing the mother matrix in its memory and reading entire or a part of the mother matrix depending on the coding rate used in the transmitter. In other words, although different model matrixes are conventionally stored in the memory depending on each coding rate, if encoding and decoding are performed using the mother matrix suggested in this embodiment of the present invention, entire or a part of one mother matrix are used. Thus, various kinds of coding rates can be supported with a small sized memory.

As described above, the systematic parts of the respective regions of the mother matrix according to this embodiment of the present invention preferably have different weight densities. Hereinafter, weight of the systematic part of the sub-matrix divided depending on the respective regions will be described.

Weight density for row or column in the systematic part of each sub-matrix of the mother matrix is preferably determined by each sub-matrix. The weight represents the number of non-zero elements which are not '0' in a specific row or column. Also, the weight density represents a rate between non-zero elements and entire elements in a specific row or column. In more detail, it is preferable that the weight density of row or column for the systematic part of the first sub-matrix 1201 is the highest. It is preferable that the weight density of row or column for the systematic part of the second sub-matrix 1202 is the second highest. It is also preferable that the weight density of row or column for the systematic part of the third sub-matrix 1203 is the third highest. It is also preferable that the weight density of row or column for the systematic part of the mother matrix 1204 is the lowest.

In other words, the weight density of row or column for the systematic part of the mother matrix 1204 is preferably determined differently depending on the systematic part determined depending on the coding rate. Also, it is more preferable that the weight density of row or column for the systematic part which supports a high coding rate is higher than the weight density of row or column for the systematic part which supports a low coding rate.

Hereinafter, a method of encoding data using the mother matrix according to the first embodiment of the present invention and retransmitting the encoded data in accordance with the HARQ scheme will be described.

Figure 15A:
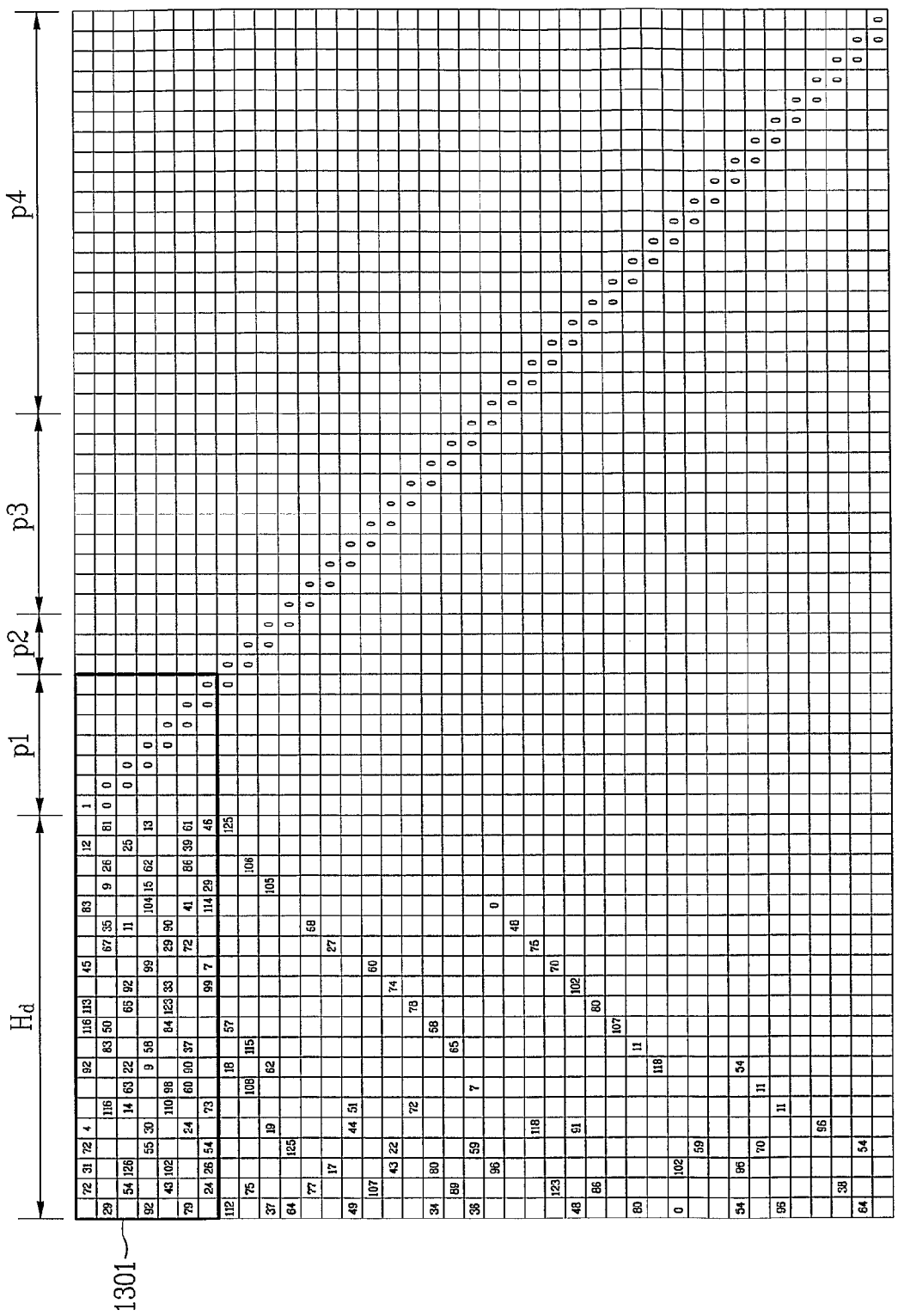
FIG. 15A to FIG. 15D are diagrams illustrating parity check matrixes according to further still another embodiment of the present invention.
Figure 15B:
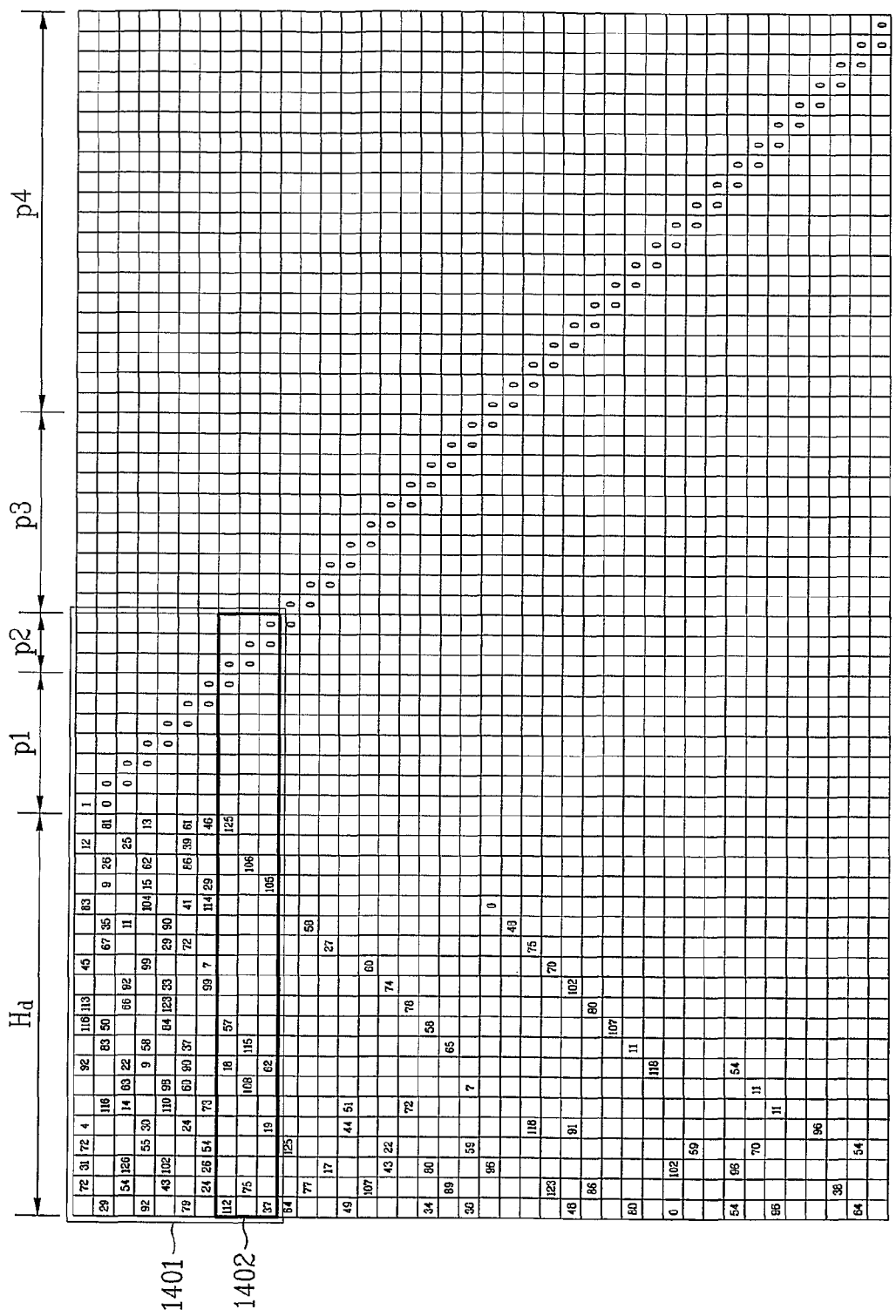
Figure 15C:
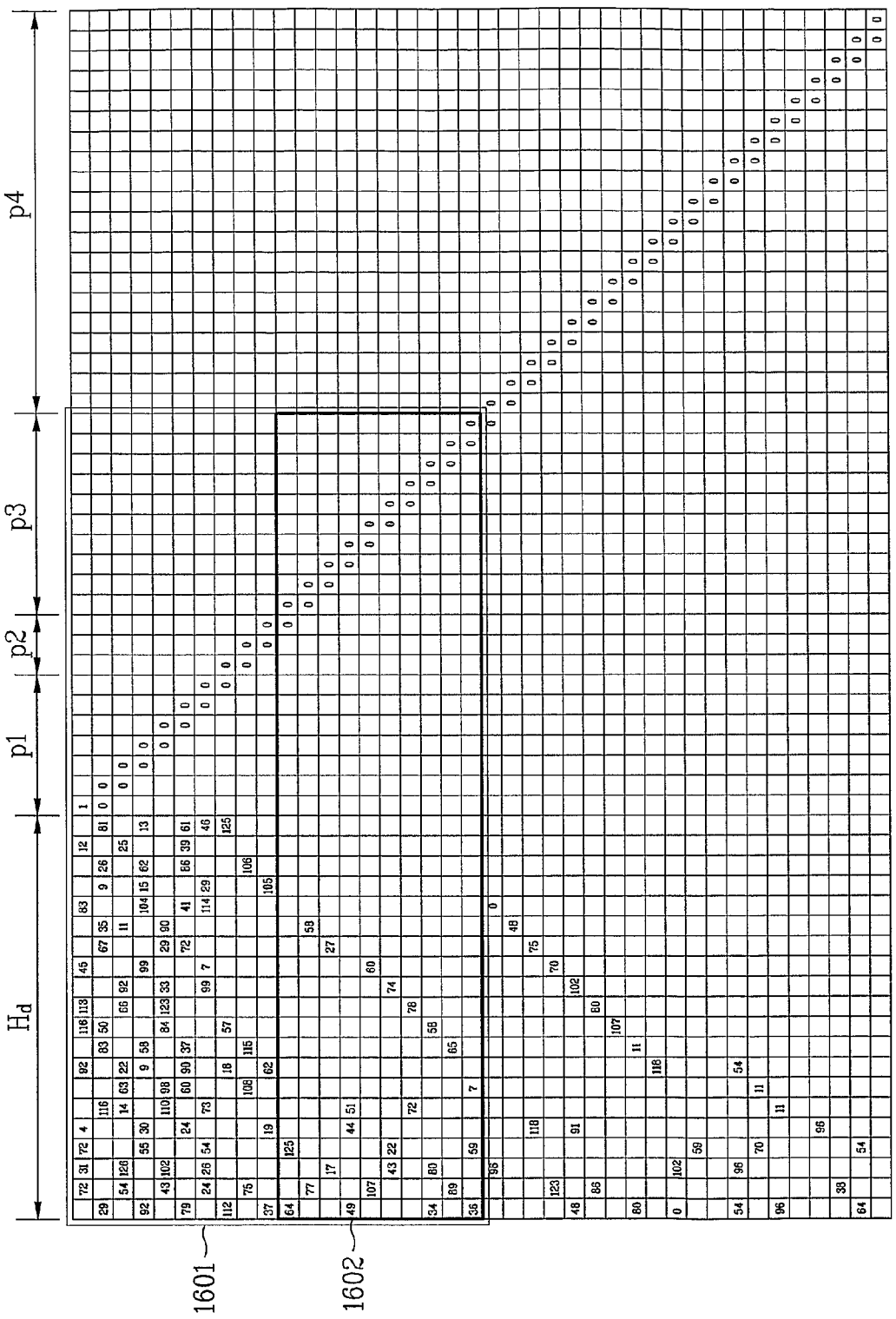
Figure 15D:
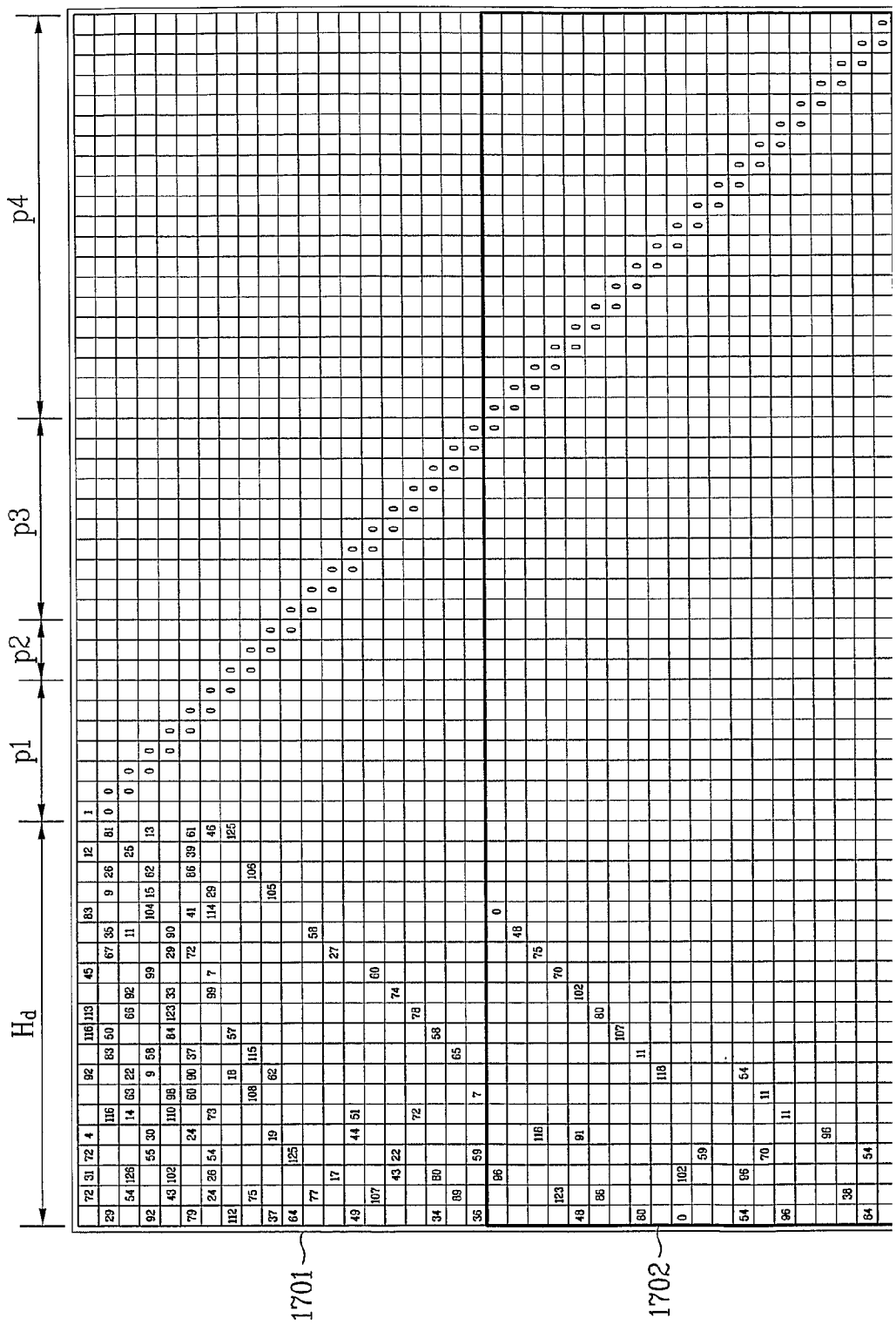

FIG. 15A and FIG. 15D illustrate a parity check matrix according to the preferred embodiment of the present invention. Hereinafter, the mother matrix of FIG. 15A and FIG. 15D divided into four regions will be described, wherein the four regions could be the same as the sub-matrixes of FIG. 13A and FIG. 13B. In other words, the systematic parts of the respective regions preferably have different weight densities.

In FIG. 15A, the transmitter performs encoding by using the first region 1301 of the mother matrix according to the first embodiment of the present invention. Since LDPC encoding is a systematic encoding method, information bits corresponding to the systematic part ($H_d$) of the mother matrix are included in the information word as they are. However, a parity bit $p_1$ calculated depending on a structure of the systematic part of the first region is additionally included in the information word.

In short, the transmitter performs encoding in accordance with the first region 1301 and transmits, to the receiver, the information word consisting of information bits ($H_d$) and parity bit $p_1$. Since a coding rate according to the encoding is determined depending on a rate between row and column of the first region, the transmitter transmits data at a coding rate of about 3/4 (exactly, coding rate of 20/27). The receiver performs decoding by using the mother matrix used in the transmitter. The receiver does not request retransmission, if no error occurs in the received data, in accordance with the HARQ scheme, but requests retransmission if error occurs. In other words, the receiver performs decoding by using the first region 1301 used in the transmitter, and sends ACK signal which does not request the transmitter of retransmission if a syndrome test succeeds. However, if the syndrome test is failed, the receiver sends NACK signal to the transmitter to request retransmission.

If the transmitter receives NACK, the transmitter performs encoding by using the mother matrix as shown in FIG. 15B. The transmitter performs encoding by using the second region 1401 of the mother matrix according to the first embodiment to decrease an actual coding rate from 3/4 to 2/3. However, since the mother matrix according to the first embodiment is designed in a lower triangle type, the transmitter does not need to perform encoding by using the entire part of the second region 1401. In other words, the transmitter may calculate $p_2$ by performing calculation for a region 1402 corresponding to the parity bit $p_2$ of the second region and transmit $P_2$ only to the receiver.

If encoding is performed using a general model matrix, encoding corresponding to the entire of the region 1401 is required. This is because that encoding of the entire of the systematic part is required to calculate a specific parity bit in case of the general model matrix. In other words, calculation for the entire of the region 1301 of FIG. 15A and calculation for the entire of the region 1401 of FIG. 15B are sequentially required. Also, the transmitter which uses the general model matrix transmits the information bits including $H_d$ and $p_1$ by performing encoding of FIG. 15A and transmits the information bits including $H_d$, $p_1$ and $p_2$ by again performing encoding of FIG. 15B. In other words, the transmitter should retransmit the parity bits which have been already transmitted before receiving the NACK signal.

However, since the mother matrix according to the first embodiment is the model matrix designed depending on the lower triangle type, the transmitter can calculate only the region 1402 corresponding to the additional parity bits to calculate the additional parity bits $p_2$ and transmit only the additional parity bist to the receiver.

The reason why that partial calculation can be performed using the mother matrix according to the first embodiment will be described with reference to FIG. 16.

FIG. 16 illustrates an example of encoding performed by the parity check matrix of the lower triangle type according to the first embodiment. In the example of FIG. 16, although encoding will be described based on the parity check matrix operated in a bit unit for convenience of description, the encoding method according to the present invention may be applied to both the model matrix and the parity check matrix, and the encoding operation may be performed in a bit unit or sub-block unit.

Information bits of FIG. 16 are $a_0, a_1, a_2, a_3$, and parity bits $p_0, p_1, p_2, p_3$ may additionally be provided by the parity check matrix of FIG. 16. Among the parity bits, the first parity bit $p_0$ is calculated through calculation of a part of the systematic part of FIG. 16. In other words, $p_0$ can be calculated through only calculation $p_0 = a_1 \oplus a_3$ for the first row of FIG. 16. Also, $p_1$ can be calculated through only calculation $p_1 = a_0 \oplus a_2 \oplus p_0$ for the second row of FIG. 16. When the value $p_1$ is being obtained, the value $p_0$ is required but is not needed to be newly obtained because the value $p_0$ is already calculated. Likewise, $p_2$ and $p_3$ can be obtained. In short, if a codeword which include $a_0, a_1, a_2, a_3, p_0$ are generated to obtain the $p_0$, encoding is only needed for the first row of FIG. 16. If calculation of $p_1$ is additionally required after $p_0$ is obtained, encoding for the second row of FIG. 16 can be performed without encoding for the first row of FIG. 16. Consequently, if the mother matrix of the lower triangle type according to the first embodiment is used, calculation for the region corresponding to the additional parity bit is performed, and only the additional parity bit can be transmitted.

The receiver performs decoding using the region 1401 of FIG. 15B used in the transmitter. In more detail, since the receiver uses the IR method of the HARQ scheme, the receiver performs decoding by together receiving transmission data $H_d$, $p_1$ received at a coding rate of 3/4 and a part $p_2$ of encoded data which has not been used for initial transmission. The receiver sends ACK signal which does not request the transmitter of retransmission if a syndrome test succeeds. However, if the syndrome test is failed, the receiver sends NACK signal to the transmitter to request retransmission.

If the transmitter receives the NACK signal after sending a signal of a coding rate of 2/3, the transmitter performs encoding by using the mother matrix as shown in FIG. 15C. The transmitter performs encoding by using the third region 1601 of FIG. 15C to decrease an actual coding rate from 2/3 to 1/2. However, since the mother matrix according to the first embodiment is designed in a lower triangle type, the transmitter does not need to perform encoding by using the entire part of the third region 1601. In other words, the transmitter may calculate $p_3$ by performing calculation for the region 1602 corresponding to the parity bit $p_3$ of the third region and transmit $P_3$ only to the receiver.

The receiver performs decoding by using the region 1601 of FIG. 15C used in the transmitter. In more detail, since the receiver uses the IR method of the HARQ method, the receiver performs decoding by together receiving transmission data $H_d$, $p_1$ received at a coding rate of 3/4, a part $p_2$ of encoded data which has not been used for initial transmission and a parity bit $p_3$. The receiver sends ACK signal which does not request the transmitter of retransmission if a syndrome test succeeds. However, if the syndrome test is failed, the receiver sends NACK signal to the transmitter to request retransmission.

If the transmitter receives the NACK signal after sending a signal of a coding rate of 1/2, the transmitter performs encoding by using the mother matrix as shown in FIG. 15D. The transmitter performs encoding by using the fourth region 1701 of the mother matrix according to the first embodiment, i.e., the entire region, so as to decrease an actual coding rate from 1/2 to 1/3. However, since the mother matrix according to the first embodiment is designed in a lower triangle type, the transmitter does not need to perform encoding by using the entire part of the fourth region 1701. In other words, the transmitter may calculate $p_4$ by performing calculation for the region 1702 corresponding to the parity bit $p_4$ of the fourth region and transmit $P_4$ only to the receiver.

The receiver performs decoding by using the region 1701 of FIG. 15D used in the transmitter. Since the receiver uses the IR method of the HARQ method, the receiver performs decoding by together receiving transmission data $H_d$, $p_1$ received at a coding rate of 3/4, a parity bit $p_2$ which has not been used for initial transmission, a parity bit $p_3$, and a parity bit $p_4$. The receiver sends ACK signal which does not request the transmitter of retransmission if a syndrome test succeeds. However, if the syndrome test is failed, the receiver sends NACK signal to the transmitter to request retransmission.

The mother matrix according to the first embodiment has been designed in accordance with the lower triangle type and is divided into a plurality of regions. Preferably, the systematic parts of the respective regions have different weight densities. Since weight densities of the systematic parts of the respective regions are different from one another and the weight density of the systematic part corresponding to the high coding rate is high, various coding rates can efficiently be supported through a small sized memory.

The first embodiment of the present invention is characterized in that although retransmission is performed using the IR method, a target coding rate can freely be selected by using one parity check matrix. An example of a communication method which freely selects a target coding rate includes a puncturing method used in a turbo code. The puncturing method will be compared with the first embodiment as follows. The puncturing method does not transmit a specific part of the entire mother code. According to the puncturing method, the receiver regards a part to which no data has not been transmitted as an unstable symbol or bit and performs decoding by using the entire mother matrix. On the other hand, in the first embodiment, the transmitter performs encoding by using a part of the mother matrix, and the receiver also performs decoding by using a part of the mother matrix. The difference between the first embodiment and the puncturing method will be described in view of complexity of decoding. If decoding complexity of the mother matrix and the mother code is 100 (coding rate of 3/4), the IR method which uses the puncturing method has decoding complexity of 100. However, in the first embodiment, decoding complexity is decreased depending on some region of the mother matrix determined depending on the coding rate. For example, if the target coding rate is 3/4, decoding complexity is only 32. In other words, the region of the mother matrix which should perform calculation for decoding is only 32% of the entire region of the mother matrix. If the decoding complexity is decreased, the cost of the decoder can be decreased. In addition to decrease of decoding complexity, the first embodiment is more advantageous than the puncturing method. In the puncturing method, specific data are regarded as unstable bits or symbols to perform decoding even in case of no transmission of the specific data. In this case, decoding performance is decreased. However, in the first embodiment, excellent decoding performance is obtained along with various coding rates.

If a coding rate is 1/2 and, in this case, decoding complexity is 100, decoding complexity according to each coding rate is as shown in Table 3 below.

TABLE 3

| Coding rate Scheme | Encoding complexity | | Decoding complexity | |
|---|---|---|---|---|
| | Puncturing method | First embodiment | Puncturing method | First embodiment |
| 3/4 | 100% | 52% | 100% | 52% |
| 2/3 | 100% | 64% | 100% | 64% |
| 1/2 | 100% | 100% | 100% | 100% |

As shown in Table 3, according to the related art puncturing method, encoding complexity and decoding complexity are determined depending on the coding rate of the mother matrix regardless of high and low of the coding rate. However, according to the first embodiment, since encoding complexity and decoding complexity are determined depending on the coding rate, the cost can be reduced in actual hardware.

Figure 17:
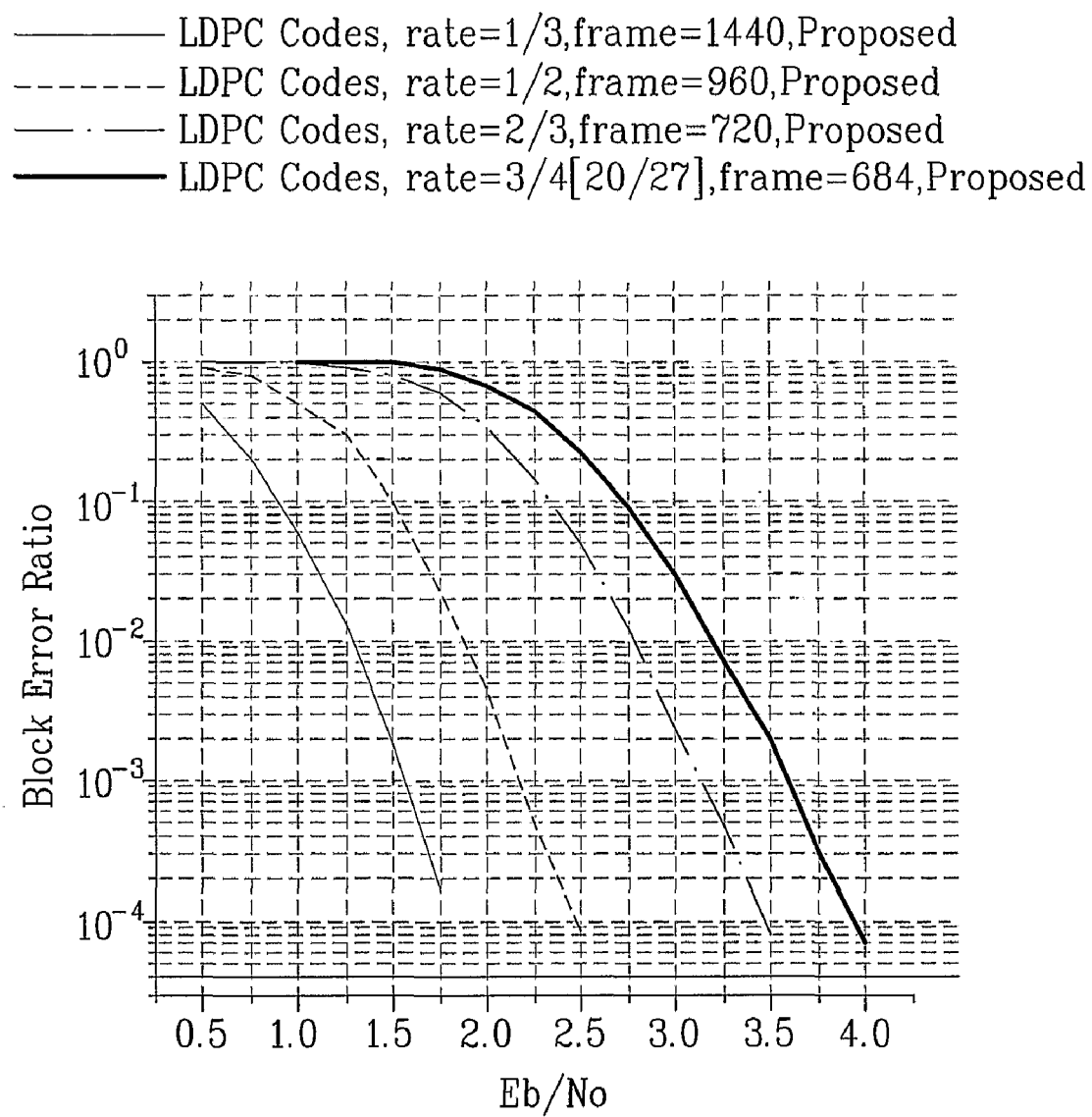
FIG. 17 is a diagram illustrating a simulation result according to the preferred embodiment of the present invention.

FIG. 17 illustrates a performance curve which supports various coding rates by using one mother matrix according to the first embodiment. As shown in FIG. 17, the encoding method according to the present invention has performance similar to or more excellent than performance the related art various encoding methods. Considering that the encoding method according to the present invention uses a smaller memory, it is noted that the present invention shows more excellent performance than performance of low density parity check code of the existing IEEE 802.16e.

Second Embodiment

The second embodiment relates to a parity check matrix in which a structure of a parity part is changed. In the second embodiment, structured LDPC code is used. In other words, the parity check matrix suggested in the second embodiment is generated by being expanded from sub-blocks of a specific size (for example, z×z). The parity part of the model matrix corresponding to the parity check matrix suggested in the second embodiment is designed in accordance with the aforementioned lower triangle type. Also, the last column of the parity part of the model matrix corresponding to the parity check matrix suggested in the second embodiment includes a plurality of nonzero elements.

Since the model matrix suggested in the second embodiment and its corresponding parity check matrix are designed in accordance with the lower triangle type, they have advantages of the aforementioned lower triangle type.

As described above, the last column of the parity part of the model matrix suggested in the second embodiment includes a plurality of weight elements. Hereinafter, features of the model matrix according to the first embodiment will be described, and features of the model matrix according to the second embodiment will also be described in comparison with features of the model matrix according to the first embodiment.

Figure 18A:
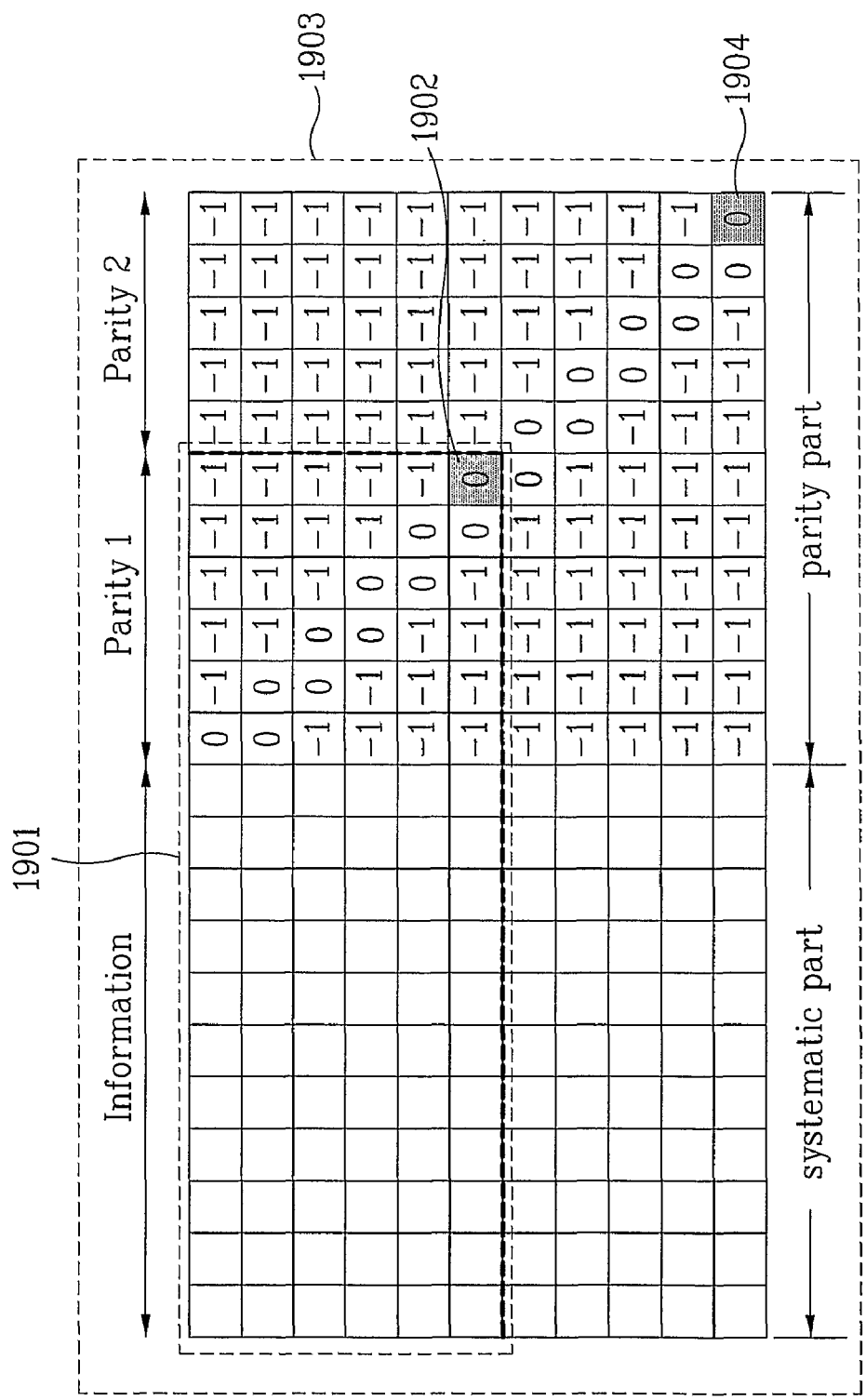
FIG. 18A is a diagram illustrating a parity part of a model matrix according to the preferred embodiment of the present invention.

FIG. 18A illustrates the parity part of the model matrix according to the first embodiment. The systematic part of FIG. 18A has random elements. Also, the model matrix according to the first embodiment supports a plurality of coding rates. For example, a region 1901 may support a first coding rate, and a region 1903 may support a second coding rate. Since the parity check matrix or the model matrix suggested in the present invention is also used in the LDPC decoder, decoding can be performed for the first coding rate by using the region 1901. In this case, the region 1902 may adversely affect the decoding performance. The influence of the region 1902 upon the decoding will be described with reference to FIG. 18B. FIG. 18B illustrates the parity part of the region 1901 of FIG. 18A. The left matrix of FIG. 18B represents the parity part as the model matrix, and the right matrix of FIG. 18B represents the expanded model matrix as the parity check matrix. In case of FIG. 18B, a specific sub-block has a size of 4×4. The region 1902 of FIG. 18A corresponds to a region of nodes C21 to C24 and nodes V21 to V24 of FIG. 18B. In FIG. 18B, the nodes C1 to C24 are check nodes of the parity check matrix, and the nodes V1 to V24 are variable nodes of the parity check matrix. In FIG. 18B, the nodes V1 to V20 are connected with at least two check nodes. For example, the variable node V12 is connected with the check nodes C12 and C16. If decoding is performed through the parity check matrix of FIG. 18B, a probability value corresponding to a receiving signal received from a radio channel is input to the variable node of the parity check matrix. In this case, since the nodes V1 to V20 are connected with the plurality of check nodes, even though error occurs in the region by the nodes V1 to V20, it is advantageous in that adverse influence due to the error is uniformly dispersed in the entire matrix. However, since the nodes V21 to V24 are connected with only one node, adverse influence due to the error is not dispersed. In other words, degradation may occur in decoding performance due to the structure of the region 1902 of FIG. 18A. Since the regions 1902 and 1904 of FIG. 18A have the same structure, if decoding is performed by the region 1903, decoding performance may be deteriorated.

In short, the regions 1902 and 1904 of FIG. 18A have the column weight of 1, which may bar message passing when decoding is performed. In other words, decoding performance may be deteriorated due to the structure of the parity part of the parity check matrix (or model matrix) according to the first embodiment.

The second embodiment is suggested to improve such features of the first embodiment. Hereinafter, the parity check matrix and the model matrix according to the second embodiment will be described.

FIG. 19 illustrates an example of the model matrix according to the second embodiment. The model matrix according to the second embodiment will now be described with reference to FIG. 19.

The parity part of the model matrix according to the second embodiment includes dual diagonal elements and is designed in accordance with the lower triangle type. Also, the last column of the parity part of the model matrix according to the second embodiment has a plurality of weight elements. A weight element means a sub-block having an index of zero or a positive integer on the model matrix. In other words, the column weight of the last column of the model matrix according to the second embodiment is greater than '2'. As shown in FIG. 19, since the last column of the model matrix according to the second embodiment includes a plurality of weight elements, the column weight is more than 2. y1 to y10 of FIG. 19 are indexes (i.e., shift numbers) for representing a specific sub-matrix (or sub-block). If at least any one of the y1 to y10 is an integer more than 0, the column weight becomes more than 2.

Since the column weight for the last column of the parity part of the model matrix according to the first embodiment is 1, a problem occurs in message passing if decoding is performed. However, according to the second embodiment, since the last column of the parity part of the model matrix includes a plurality of weight elements, decoding performance can be improved.

The example of FIG. 19 can be used for the model matrix or the parity check matrix which supports one coding rate.

However, the model matrix or the parity check matrix according to the second embodiment may support a plurality of coding rates. Hereinafter, the model matrix which supports a plurality of coding rates will be described with reference to FIG. 20.

Figure 20:
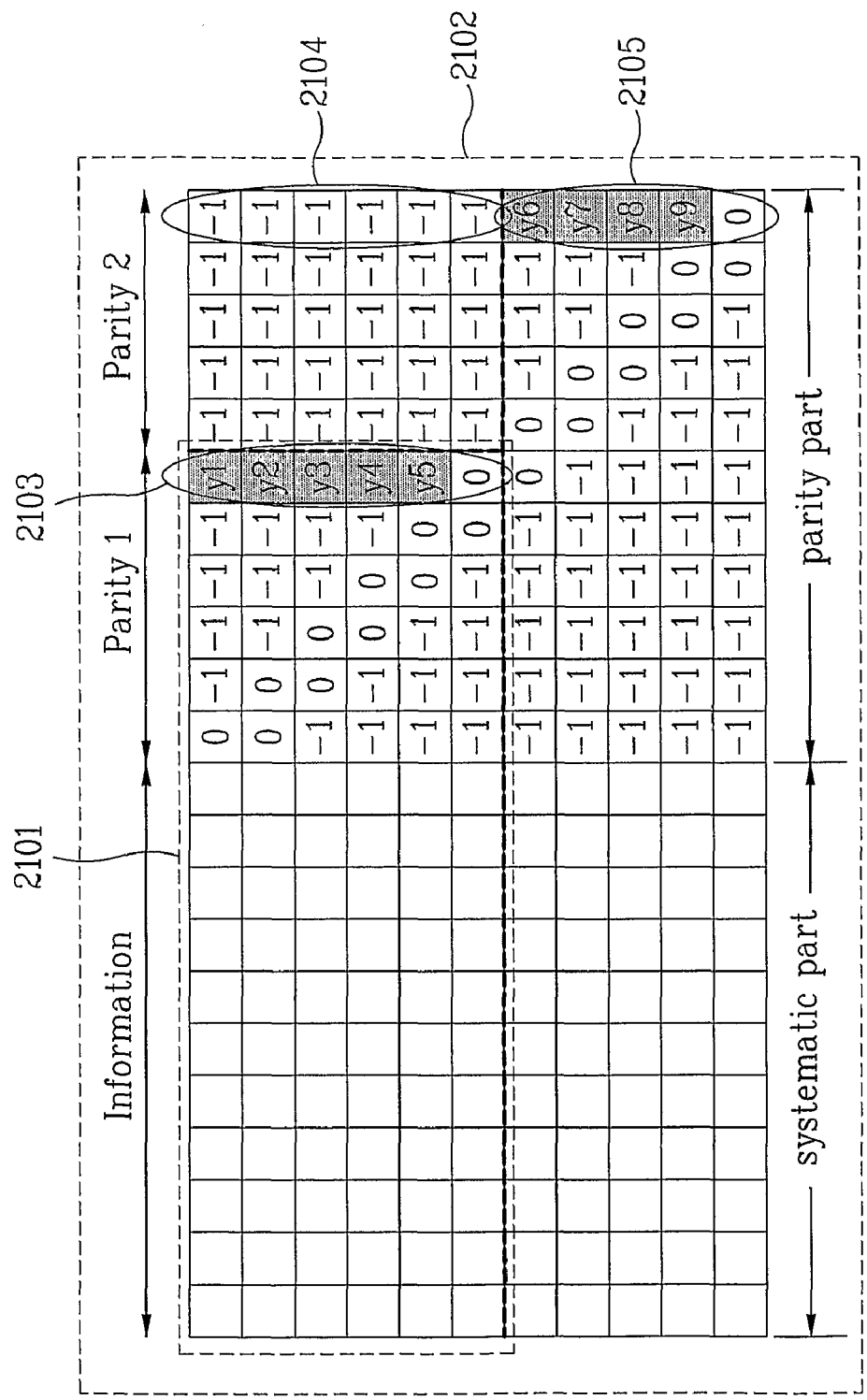
FIG. 20 is a diagram illustrating an example of a model matrix which supports two coding rates in accordance with another embodiment of the present invention.

FIG. 20 is a diagram illustrating an example of a model matrix which supports two coding rates in accordance with the second embodiment. A region 2101 of FIG. 20 can support a first coding rate which is relatively high while a region 2102 of FIG. 20 can support a second coding rate which is relatively low.

The last column in the region 2101 for the first coding rate corresponds to a region 2103. Accordingly, a plurality of weight elements exist in the region 2103 of FIG. 20. In other words, at least any one of y1 to y5 corresponds to an index (i.e., shift number) greater than 0. If decoding is performed using the region 2101 of FIG. 20, since the column weight for every column of the parity part becomes more than 2, decoding performance can be improved.

The last column in the region 2102 for the second coding rate corresponds to the regions 2104 and 2105. Accordingly, if decoding is performed using the region 2102, it is preferable that a plurality of weight elements exist in the regions 2104 and 2105.

In short, the matrix of FIG. 20 is divided into two regions, wherein the last column of each region preferably includes a plurality of weight elements. Decoding performance is improved by the structure of the parity part. Also, if a plurality of coding rates are supported, various retransmission methods such as HARQ can be used with a variable coding rate.

However, if the IR method is used in the same manner as the first embodiment, the last column of the parity part is preferably designed as follows.

In FIG. 20, the last column in the region 2102 corresponding to the second coding rate corresponds to the regions 2104 and 2105. If the IR method is not used, the regions 2104 and 2105 may include a plurality of weight elements. However, if the IR method is used, it is preferable that the region 2104 has no weight while the region 2105 has a weight. If the region 2104 has a weight, the following problem may occur. If the IR method is used, encoding is performed using the region 2101 and information bits and parity bits corresponding to the region 2101 are transmitted to the receiver. Afterwards, if NACK is transmitted from the receiver, encoding is performed using the region 2102 and additional parity bits are only transmitted to the receiver. The reason why the additional parity bits are only transmitted to the receiver is that parity bits (hereinafter, referred to as 'first parity bits') corresponding to parity 1 of FIG. 20 are fixed regardless of the region where encoding is performed. However, if the region 2104 has a weight, a polynomial which generates parity bits is varied so that the first parity bits by the region 2101 and the first parity bits by the region 2102 are varied. Accordingly, it is preferable that the region 2104 does not include a weight element while the region 2105 includes a plurality of weight elements. In other words, if the parity part is divided into a plurality of regions to support a plurality of coding rates, it is preferable that the weight element included in the last column of the parity part corresponding to a low coding rate is non-overlapped with the weight element of the parity part corresponding to a high coding rate in a row direction. In other words, it is preferable that the weight elements have different rows.

In short, a plurality of regions exist on the model matrix to support a plurality of coding rates. Also, the parity part of the model matrix includes dual diagonal elements, and is designed in accordance with the aforementioned lower triangle type. Each of the plurality of regions includes a plurality of weight elements in the last column to perform efficient decoding. Meanwhile, if the IR method is used, it is preferable that the weight element included in the last column of the parity part corresponding to a low coding rate is non-overlapped with the weight element of the parity part corresponding to a high coding rate in a row direction.

Since the last column of the model matrix according to the second embodiment is advantageous for decoding due to the plurality of weight elements. However, if the number of weight elements included in the last column is an even number, a problem may occur in that complicate encoding is caused. In other words, if the column weight in the last column of the model matrix is an even number, a problem may occur in encoding. Hereinafter, the case where the column weight in the last column of the model matrix is an even number and the case where the column weight in the last column of the model matrix is an odd number will be described respectively.

FIG. 21A is an example of a parity check matrix in which the weight of the last column is an even number. Although the example of the parity check matrix in which the weight of the last column is an even number will be described with respect to FIG. 21A and FIG. 21B, the present invention is applied to both the parity check matrix and the model matrix. If encoding is performed using the matrix of FIG. 21A, the parity bits p1 to p6 are calculated depending on the structure of the parity check matrix. In other words, solutions of six polynomials are obtained by determining the parity bits p1 to p6 as unknown numbers depending on the matrix of FIG. 21A, thereby completing encoding. Referring to FIG. 21A, since the matrix is designed in accordance with the lower triangle type structure, p1 is directly calculated and then p2 and p3 are sequentially calculated. However, in case of a polynomial corresponding to the fourth row of FIG. 21A, since unknown numbers p4 and p6 should be obtained, these unknown numbers p4 and p6 cannot be obtained by only calculation of a polynomial corresponding to the fourth row. Accordingly, p4 to 6 cannot be generated sequentially by calculation of each row. In other words, encoding becomes complicated.

FIG. 21B is an example of a parity check matrix in which the weight of the last column is an odd number. If encoding is performed using the matrix of FIG. 21B, the parity bits p1 to p6 are calculated depending on the structure of the parity check matrix. In other words, solutions of six polynomials are obtained by determining the parity bits p1 to p6 as unknown numbers depending on the matrix of FIG. 21B, thereby completing encoding. Referring to FIG. 21B, since the matrix is designed in accordance with the lower triangle type structure, p1 is directly calculated and then p2 and p3 are sequentially calculated. Meanwhile, in case of a polynomial corresponding to the third row of FIG. 21A, unknown numbers p3 and p6 should be obtained. However, if polynomials corresponding to the third row to the sixth row of FIG. 21A are added to one another, all parity bits except for p6 are erased. In other words, since the weight of the last column is an odd number, the parity bit corresponding to the last column is not erased. Since p6 is not erased, p6 can easily be calculated and then the other parity bits p3 to p5 can be calculated. It is noted that the encoding procedure according to FIG. 21B is simplified as compared with the encoding procedure according to FIG. 21A.

As described above, when the parity part of the model matrix is designed in accordance with the lower triangle type, the parity part can be calculated even in case that some of the information bits of the model matrix is calculated. In other words, encoding of high speed can be performed. However, if the last column of the parity part has the weight of the even number in accordance with the second embodiment, encoding may be complicated. Accordingly, it is preferable that the last column of the parity part includes the weight of the odd number. In other words, the last column of the parity part has a weight of 3, 5, 7, etc.

Hereinafter, encoding by the matrix suggested in the second embodiment will be described with reference to the following equations. The parity check matrix suggested in the second embodiment can be expressed by the systematic part $H_{b1}$ and the parity part $H_{b2}$ corresponding to the information bits one to one as shown in the following equations 7 and 8.

$$H = \begin{bmatrix} P_{0,0} & P_{0,1} & P_{0,2} & \ldots & P_{0,n_b-2} & P_{0,n_b-1} \\ P_{1,0} & P_{1,1} & P_{1,2} & \ldots & P_{1,n_b-2} & P_{1,n_b-1} \\ P_{2,0} & P_{2,1} & P_{2,2} & \ldots & P_{2,n_b-2} & P_{0,n_b-1} \\ \ldots & \ldots & \ldots & \ldots & \ldots & \ldots \\ P_{m_b-1,0} & P_{m_b-1,1} & P_{m_b-1,2} & \ldots & P_{m_b-1,n_b-2} & P_{m_b-1,n_b-1} \end{bmatrix}$$ [Equation 7]

$$= P^{H_b}$$

$$H_b = \left[ (H_{b1})_{m_b * k_b} \mid (H_{b2})_{m_b * m_b} \right]$$ [Equation 8]

With respect to the codeword $x=[sp]=[s_0, s_1, \ldots, s_{k-1}, p_0, p_1, \ldots, p_{m-1}]$, encoding is to determine parity bit p by using given information words 's'. For encoding, the information word 's' can be divided into $k_b$ number of groups per z bits. In other words, grouping can be performed depending on the size (z×z) of one sub-block in the model matrix. The information word 's' divided into $k_b$ number of groups can be expressed as follows.

$$u=[u(0)u(1)\ldots u(k_b-1)]$$ [Equation 9]

In the equation 9, $u(i)=[s_{iz}s_{iz+1}\ldots s_{(i+1)z-1}]^T$ represents a column vector of z×1.

A grouping method of the information word 's' can be applied to a parity bit 'v' as follows.

$$v=[v(0)v(1)\ldots v(m_b-1)]$$ [Equation 10]

In the equation 10, $v(i)=[p_{iz}p_{iz+1}\ldots p_{(i+1)z-1}]^T$ represents a column vector of z×1.

If the codeword having the size of 't' is transmitted using one parity check matrix, the parity 'p' can be divided into 't' number of groups as follows.

$$v=[g(0)g(1)\ldots g(t-1)]$$

$$g(i)=[v(m_{bi})v(m_{bi}+1)\ldots v(m_{bi+1}-1)], i=0, 1, \ldots, t-1$$ [Equation 11]

Figure 22:
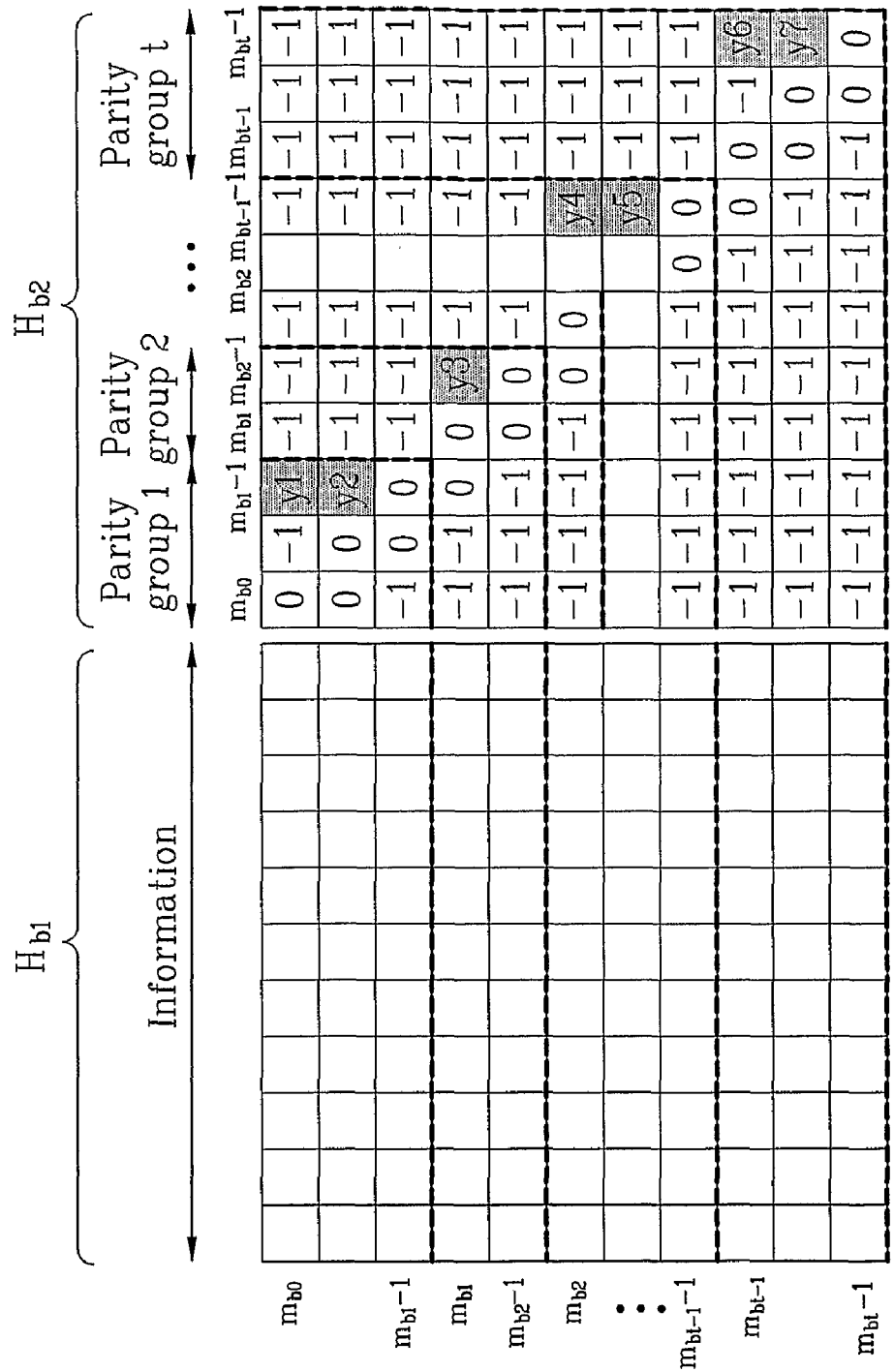
FIG. 22 is a diagram illustrating an example of a model matrix which supports 't' number of coding rates in accordance with another embodiment of the present invention.

In other words, the index on $H_{b2}$ of the $i^{th}$ parity group g(i) can be expressed as shown in FIG. 22. The weight elements are added between the $v(m_{bi})^{th}$ row and the $v(m_{bi+1}-2)^{th}$ row in the $v(m_{bi+1}-1)^{th}$ column of $H_{b2}$. At this time, if an even number of weight elements are added and have same shift numbers, encoding is simplified.

FIG. 22 illustrates an example of the model matrix which supports 't' number of coding rates in accordance with the second embodiment. As described above, the example of FIG. 22 is designed in accordance with the lower triangle type. The example of FIG. 22 is divided into 't' number of regions to support 't' number of coding rates. Also, for message passing during decoding, the last column of each region preferably has a plurality of weight elements. In other words, it is preferable that y1 to y7 of FIG. 22 are indexes having integers more than 0.

In FIG. 22, the last columns ($m_{b1}-1, m_{b2}-1, \ldots, m_{bt}-1, m_{bt}-1$) of the 't' number of regions have a plurality of weights. Also, as described above, to simplify encoding, the last column of each region preferably has odd number of weights. However, to use the IR method as described above, it is preferable that the weight elements included in the last column of the parity part corresponding to a low coding rate are non-overlapped with the weight element of the parity part corresponding to a high coding rate in a row direction. Accordingly, the $(m_{b2}-1)^{th}$ column of FIG. 22 has even number of weight elements to support the IR method.

Figure 23:
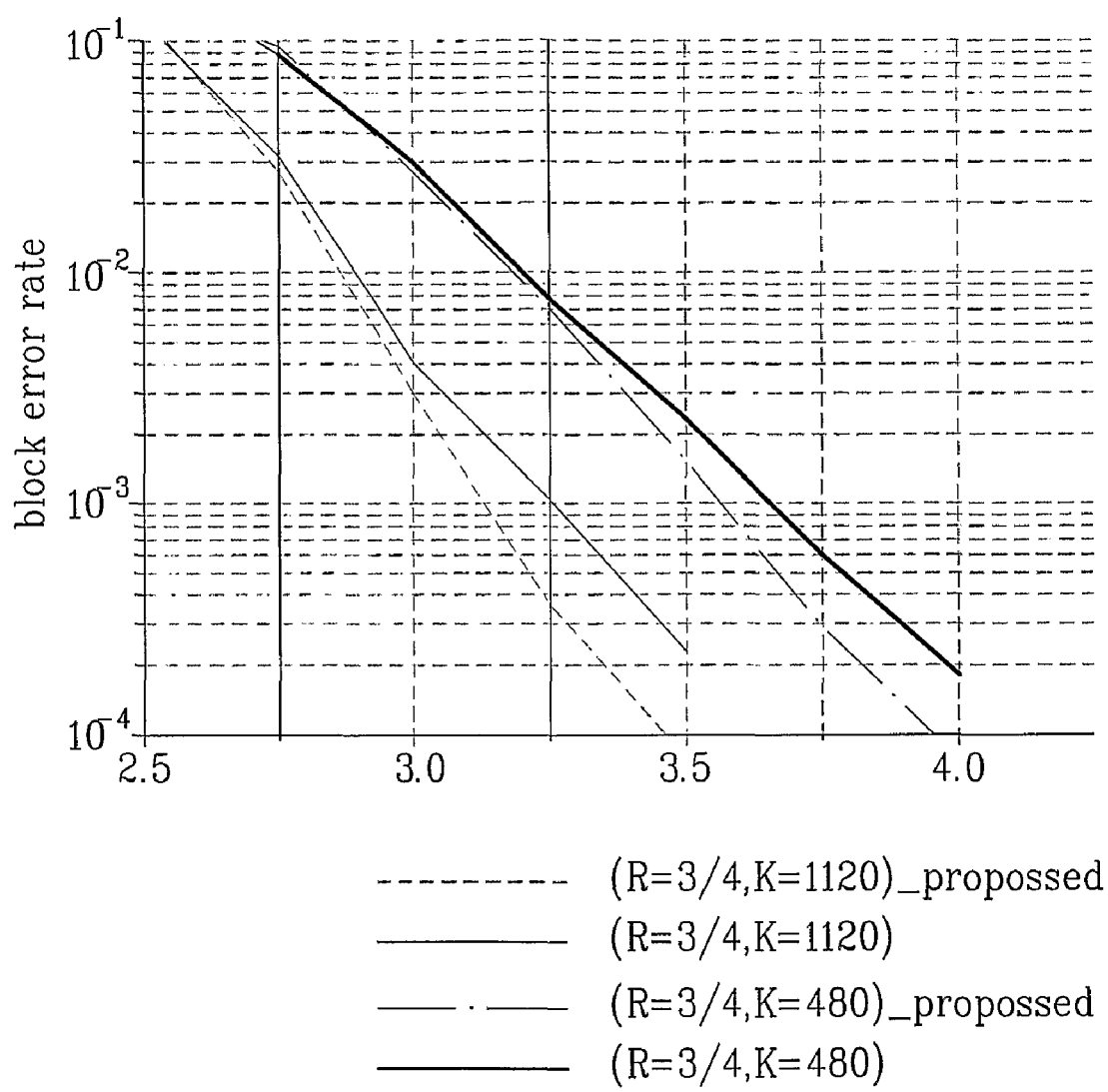
FIG. 23 is a diagram illustrating a simulation result according to another embodiment of the present invention.

FIG. 23 is a diagram illustrating improved performance according to the second embodiment of the present invention. The parity check matrix according to the first embodiment acts to deteriorate performance due to the presence of the region where the column weight is 1 in spite of an advantage in supporting a variable coding rate. However, the parity check matrix according to the second embodiment provides more improved performance than that of the first embodiment. Particularly, the second embodiment has an advantage in that error floor is reduced in a high SNR region in comparison with the existing method.

Figure 24:
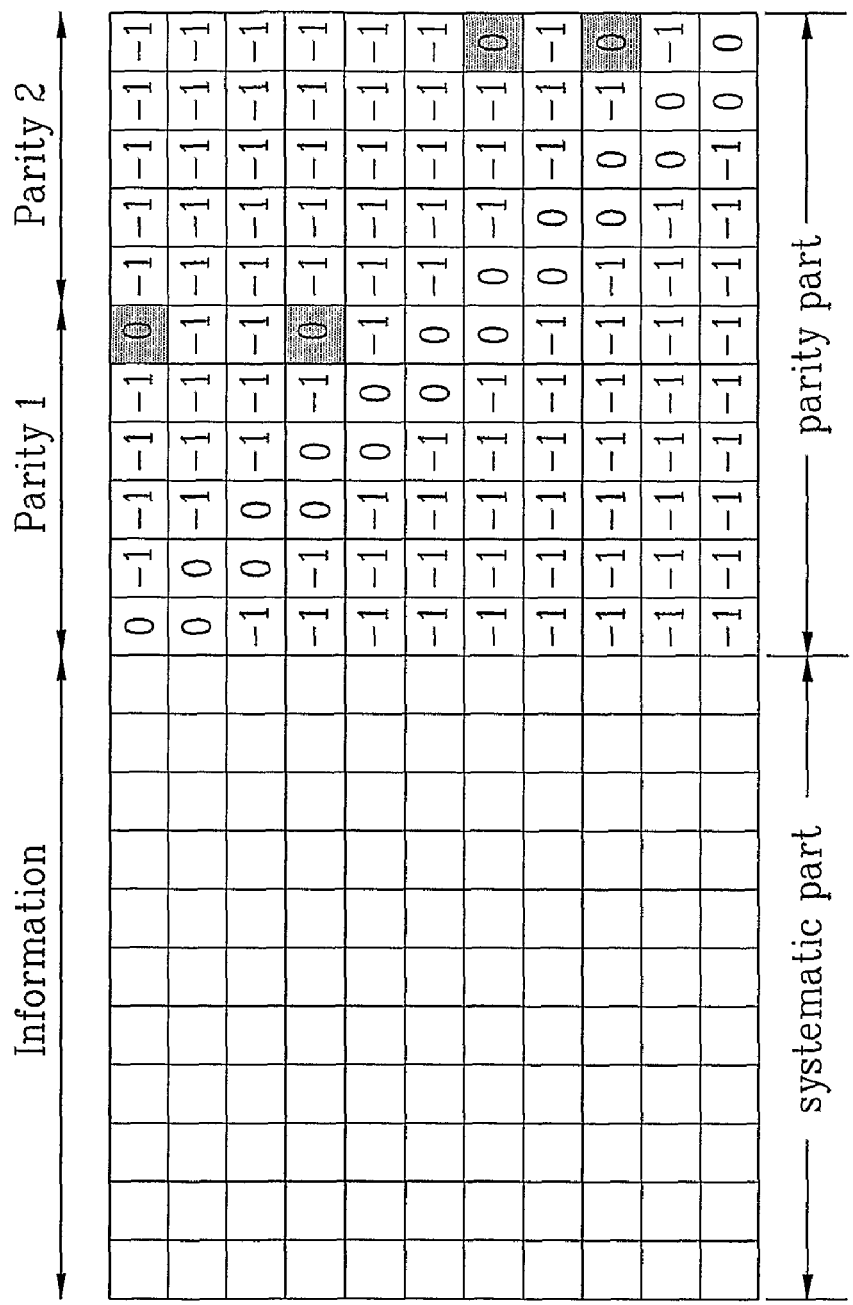
FIG. 24 is a diagram illustrating an example of a model matrix according to another embodiment of the present invention.

FIG. 24 is an example of the model matrix according to the second embodiment of the present invention. The matrix of FIG. 24 can support two coding rates, and the IR method can be applied to the matrix of FIG. 24. Also, the example of FIG. 24 has more improved performance than that of the related art during decoding.

The aforementioned coding rates, the sizes of the matrixes, and weight features are only exemplary to describe the present invention, and the present invention is not limited to the aforementioned numerical values. In other words, the above conditions such as the coding rates may freely be changed.

Unlike the related art which uses a separate parity check matrix depending on a coding rate, the present invention has advantages in that memory efficiency is improved and scheduler is simplified. The present invention provides performance similar to or more excellent than performance of the related art.

For example, 321 number of memories are required to allow the related art IEEE 802.16e LDPC code to support a coding rate of 1/3 to 3/4. However, if one mother matrix is used and the systematic part is designed in accordance with the embodiment of the present invention, the advantage corresponding to the related art advantage can be obtained with only 115 memories.

As shown in FIG. 17, the encoding method according to the present invention has performance similar to or more excellent than performance of the various encoding methods of the related art. Considering that the encoding method according to the present invention uses smaller memories, the present invention provides more excellent performance than the low density parity check code of the existing IEEE 802.16e.

Referring to FIG. 23, it is noted that performance is more improved than the related art. In case of a coding rate of r=3/4 and the information bit length of k=480 and 1120, it is noted that performance is improved when the method suggested in the present invention is used. In other words, it is noted that performance is more improved in the high SNR region than the related art method (performance improvement of more than about 0.2 dB around k=1120, Eb/No=3.5 dB). According to the present invention, error floor occurring in the high SNR region can be reduced as shown in FIG. 24.

It will be apparent to those skilled in the art that the present invention can be embodied in other specific forms without departing from the spirit and essential characteristics of the invention. Thus, the above embodiments are to be considered in all respects as illustrative and not restrictive. The scope of the invention should be determined by reasonable interpretation of the appended claims and all change which comes within the equivalent scope of the invention are included in the scope of the invention.

Industrial Applicability

The present invention can be applied to every field where encoding and decoding are used, as well as a wireless communication system such as a mobile communication system or a wireless Internet system.

The invention claimed is:

1. A method of encoding data by low density parity check (LDPC) code using a parity check matrix, the method comprising:
encoding a first input data stream using a first sub-matrix of a parity check matrix including at least two sub-matrixes; and
encoding a second input data stream using a second sub-matrix of the parity check matrix.

2. The method of claim 1, wherein the first sub-matrix or the second sub-matrix is a part of the second sub-matrix or the first sub-matrix, respectively.

3. The method of claim 1 or 2, wherein the at least two sub-matrixes correspond to different coding rates.

4. The method of claim 3, wherein a sub-matrix corresponding to a higher coding rate is a part of a sub-matrix corresponding to a lower coding rate.

5. The method of claim 3, wherein each of the at least one sub-matrixes has different low or column weight.

6. The method of claim 5, wherein a row or column weight density of a sub-matrix corresponding to a high coding rate is greater than a row or column weight of a sub-matrix corresponding to a low coding rate.

7. The method of claim 1, wherein each of the at least two sub-matrixes includes a systematic part and a parity part.

8. The method of claim 7, wherein the parity part is a lower triangle type.

9. The method of claim 8, wherein a column included in the last sub-block of the parity part of each sub-matrix has a weight more than 2.

10. The method of claim 9, wherein a column included in the last sub-block of the parity part of each sub-matrix has a weight of an odd number.

11. The method of claim 7, wherein the systematic part of each sub-matrix has different weights.

12. The method of claim 11, wherein a row or column weight density of a systematic part of a sub-matrix corresponding to a high coding rate is greater than a row or column weight of a systematic part of a sub-matrix corresponding to a low coding rate.

13. The method of claim 1, wherein the parity check matrix includes a plurality of sub-blocks, each of which is identified by an index.

14. The method of claim 13, wherein each of the sub-blocks is generated by permutation of a base matrix depending on a predetermined rule.

15. The method of claim 14, wherein each index is information which indicates the predetermined rule.

16. The method of claim 15, wherein, if the parity check matrix is in a form of a model matrix, each of the encoding steps includes:
generating the parity check matrix by expanding the model matrix depending on the predetermined rule indicated by each index; and
encoding the first or second data stream by using the generated parity check matrix.

17. The method of claim 13, wherein each index is a shift number of a row or column of each sub-block from the base matrix.

18. A method of encoding data by low density parity check (LDPC) code using a parity check matrix, the method comprising:
variably selecting a sub-matrix from a parity check matrix in accordance with a coding rate to be used for encoding, the parity check matrix including at least two sub-matrixes; and
encoding an input data stream using the selected sub-matrix.

19. The method of claim 18, wherein a first sub-matrix corresponding to a lower coding rate includes a second sub-matrix corresponding to a higher coding rate, the first and second sub-matrixes included in the parity check matrix.

20. The method of claim 19, wherein each of the at least two sub-matrixes includes an systematic part and a parity part.

21. The method of claim 20, wherein the parity part is a lower triangle type.

22. The method of claim 20, wherein a column included in a last sub-block of the parity part of each sub-matrix has a weight more than 2.

23. The method of claim 22, wherein a column included in the last sub-block of the parity part of each sub-matrix has a weight of an odd number.

24. A method of transmitting data in a communication system, the method comprising:
encoding an input data stream using a first sub-matrix of a parity check matrix including at least two sub-matrixes;
transmitting a first data packet encoded by the first sub-matrix to a receiving side;
receiving a negative reception acknowledgement (NACK) signal from the receiving side in response to the first data packet;
encoding the input data stream using a second sub-matrix of the parity check matrix; and
transmitting a second data packet encoded by the second sub-matrix to the receiving side.

25. The method of claim 24, wherein the second sub-matrix includes the first sub-matrix.

26. The method of claim 25, wherein a coding rate corresponding to the second sub-matrix is smaller than a coding rate corresponding to the first sub-matrix.

27. The method of claim 25, wherein each of the at least two sub-matrixes includes a systematic part and a parity part.

28. The method of claim 27, wherein the parity part is a lower triangle type.

29. The method of claim 28, wherein the step of encoding the input data stream using the second sub-matrix includes performing encoding operation using only an additional part of the second sub-matrix other than the first sub-matrix.

30. The method of claim 29, wherein the additional part is a part corresponding to additional parity bits.

31. The method of claim 30, wherein the step of transmitting the second data packet includes transmitting the additional parity bits only.

32. The method of claim 24, wherein the parity check matrix includes a plurality of sub-blocks identified by each index.

33. The method of claim 32, wherein each of the sub-matrixes is generated by permutation of a base matrix depending on a predetermined rule.

34. The method of claim 33, wherein each index is information which indicates the predetermined rule.

35. The method of claim 34, wherein, if the parity check matrix is in a form of a model matrix, each of the encoding steps includes:
generating the parity check matrix by expanding the model matrix depending on the predetermined rule indicated by each index; and
encoding the first or second data stream by using the generated parity check matrix.

36. A method of transmitting data in a communication system, the method comprising:
transmitting a first data packet encoded by a first sub-matrix of a parity check matrix to a receiving side, the parity check matrix including at least two sub-matrixes;
receiving a retransmission request message for the first data packet from the receiving side; and
transmitting a second data packet encoded by a second sub-matrix of the parity check matrix to the receiving side.

37. A method of encoding by LDPC code using a parity check matrix, the method comprising:
receiving codeword encoded by a specific sub-matrix variably selected from a parity check matrix in accordance with a coding rate to be used for encoding, the parity check matrix including at least two sub-matrixes;
acquiring control information indicating the specific sub-matrix; and
decoding the codeword by using the specific sub-matrix.

38. A method of supporting data retransmission in a communication system, the method comprising:
receiving a first data packet encoded by a first sub-matrix of a parity check matrix from a transmitting side, the parity check matrix including at least two sub-matrixes;
transmitting a retransmission request message for the first data packet to the transmitting side when decoding of the first data packet is failed; and
receiving a second data packet encoded by a second sub-matrix of the parity check matrix from the transmitting side.

39. An encoder for encoding data by LDPC code, comprising:
a memory module storing a parity check matrix including at least two sub-matrixes; and
an encoding module encoding an input data stream by variably selecting a specific sub-matrix of the at least two sub-matrixes in accordance with a coding rate to be used for encoding.

40. The encoder of claim 39, wherein the parity check matrix is stored in the memory module in a form of a model matrix.

\* \* \* \* \*